(12) United States Patent
Endo et al.

(10) Patent No.: US 8,461,630 B2
(45) Date of Patent: Jun. 11, 2013

(54) SEMICONDUCTOR DEVICE AND MANUFACTURING METHOD THEREOF

(75) Inventors: Yuta Endo, Atsugi (JP); Kosei Noda, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/299,644

(22) Filed: Nov. 18, 2011

(65) Prior Publication Data
US 2012/0138921 A1 Jun. 7, 2012

(30) Foreign Application Priority Data

Dec. 1, 2010 (JP) ................................. 2010-268444
Feb. 2, 2011 (JP) ................................. 2011-020648

(51) Int. Cl.
*H01L 29/66* (2006.01)
(52) U.S. Cl.
USPC ............. 257/217; 257/71; 257/72; 257/368; 257/E51.005; 257/E29.151; 438/76; 438/146; 438/149; 438/151
(58) Field of Classification Search
None
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| EP | 1737044 A | 12/2006 |
| EP | 2226847 A | 9/2010 |

(Continued)

OTHER PUBLICATIONS

Park et al., "High performance amorphous oxide thin film transistors with self-aligned top-gate structure," IEDM 09: Technical Digest of International Electron Devices Meeting, Dec. 7, 2009, pp. 191-194.

(Continued)

*Primary Examiner* — Tan N Tran
*Assistant Examiner* — Scott R Wilson
(74) *Attorney, Agent, or Firm* — Eric J. Robinson; Robinson Intellectual Property Law Office, P.C.

(57) ABSTRACT

A conductive film to be a gate electrode, a first insulating film to be a gate insulating film, a semiconductor film in which a channel region is formed, and a second insulating film to be a channel protective film are successively formed. With the use of a resist mask formed by performing light exposure with the use of a photomask which is a multi-tone mask and development, i) in a region without the resist mask, the second insulating film, the semiconductor film, the first insulating film, and the conductive film are successively etched, ii) the resist mask is made to recede by ashing or the like and only the region of the resist mask with small thickness is removed, so that part of the second insulating film is exposed, and iii) the exposed part of the second insulating film is etched, so that a pair of opening portions is formed.

24 Claims, 17 Drawing Sheets

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,223,643 B2 | 5/2007 | Ohnuma et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,738,050 B2 | 6/2010 | Yamazaki et al. |
| 7,833,846 B1 * | 11/2010 | Choi et al. ............... 438/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102315 A1 | 4/2010 | Suzawa et al. |
| 2010/0105162 A1 | 4/2010 | Suzawa et al. |
| 2010/0105163 A1 | 4/2010 | Ito et al. |
| 2010/0105164 A1 | 4/2010 | Ito et al. |
| 2010/0109002 A1 | 5/2010 | Itagaki et al. |
| 2010/0109058 A1 | 5/2010 | Sakata et al. |
| 2010/0117073 A1 | 5/2010 | Yamazaki et al. |
| 2010/0295041 A1 | 11/2010 | Kumomi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-179069 | 6/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2010-133020 | 6/2010 |
| JP | 2010-135774 | 6/2010 |
| WO | WO-2004/114391 | 12/2004 |

OTHER PUBLICATIONS

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. Eng, 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Eng, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, Eng. pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Eng. Physics Letters), Jun. 26, 2007, vol. 90, No. 26, pp. 262106-1-262106-3.

Takahashi.M et al., "Theoretical Analysis of Igzo Transparent Amorphous Oxide Semiconductor,", IDW '08: Proceedings of the 15th International Display Workshops, Eng. Dec. 3, 2008, pp. 1637-1640.

Hayashi.R et al., "42.1: Invited Paper: Improved Amorphous In-Ga-Zn-O TFTS,", SID Digest '08: SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K at al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Physics. (Journal of Applied Physics), Feb. 1, 2003, vol. 93, No. 3, pp. 1624-1630.

Asakuma.N at al., "Crystallization and Reduction of Sol-Gel-Derived Zinc Oxide Films by Irradiation with ultraviolet lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probe using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08: SID International Symposium Digest of Technical Papers, May 20, 2008, vol. 39, pp. 633-636.

Lee.J et al., "World'S Largest (15-Inch) XgA AMLCD Panel Using IgZo Oxide TFT,", SID Digest '08: SID International Symposium Digest of Technival Papers, May 20, 2008, vol. 39, pp. 625-628.

Nowatari.H et al., "60.2: Intermediate Connector With Suppressed Voltage Loss for White Tandem OLEDs,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Trasition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09: SID International Symposium Digest of Technical Papers, May 31, 2009, pp. 280-283.

Lee.M et al., "15.4: Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDw '09: Proceedings of the 16th International Display Workshops, 2009, pp. 689-692.

Eng. Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3: Invited Paper:Transparent Amorphous Oxide Semiconductors for High Performance TFT,", SID Digest '07: SID International Symposium Digest of Technical Papers, 2007, vol. 28, pp. 1830-1833.

Godo.H et al., "P-9: Numerical Analysis on Temperature Dependence of Characteristics of Amorphous In-Ga-Zn-Oxide TFT,", SID Digest '09: SID International Symposium Digest of Technical Papers, May 31, 2009, pp. 1110-1112.

Ohara.H et al., "21.3:4.0 in. QVGA AMOLED Display Using In-Ga-Zn-Oxide TFTs With a Novel Passivation Layer,", SID Digest '09: SID International Symposium Digest of Technical Papers, May 31, 2009, pp. 284-287.

Miyasaka.M, "Suftla Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1: Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3-A2O3-BO Systems [A; Fe, Ga, or Al; B: Mg, Mn, Fe, Ni, Cu, or Zn] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phas,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 7, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size Amoled Displays,", IDW '08: Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered A1203 Gate Insulator,", Appl. Phys. Lett. (Applied Physics Letters), Sep. 1, 2003, vol. 83, No. 9, pp. 1755-1757.

* cited by examiner

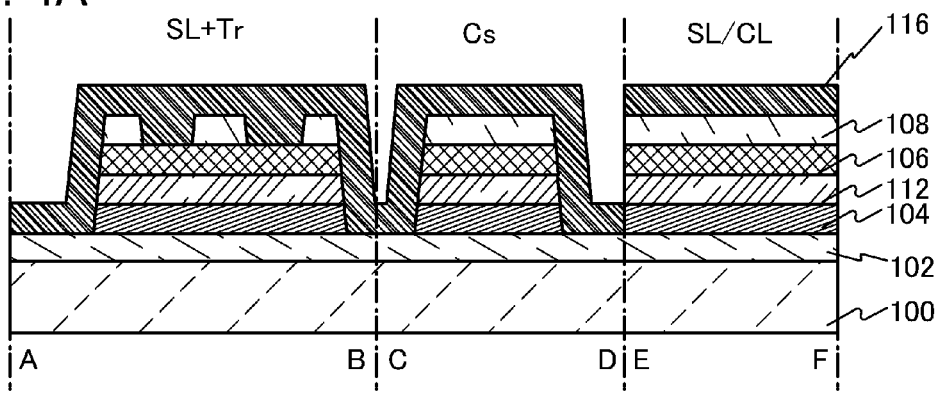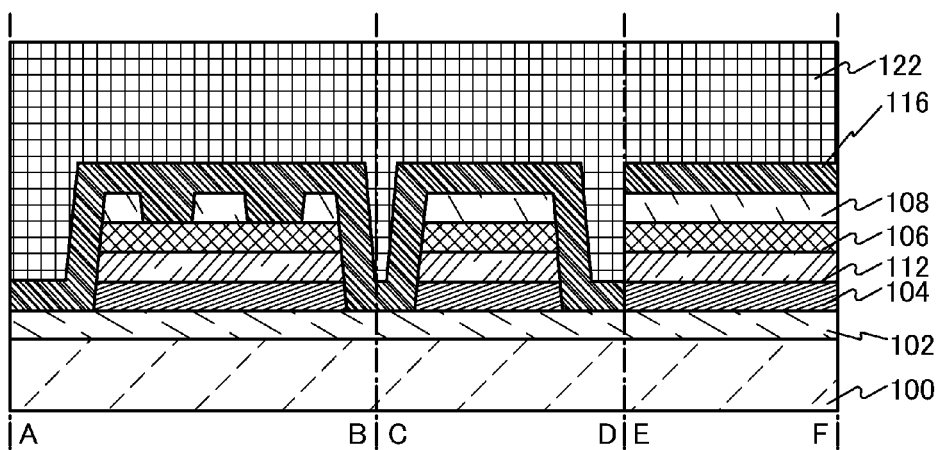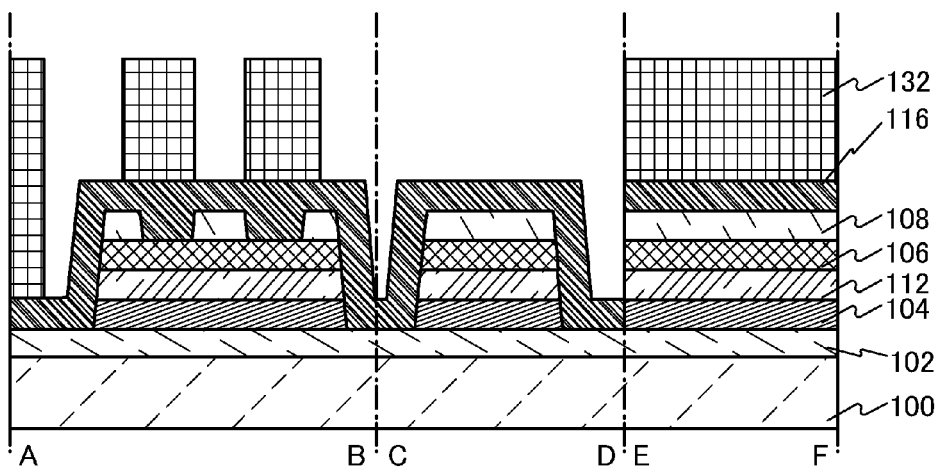

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

In this specification, a semiconductor device means all types of devices that can function by utilizing semiconductor characteristics, and a semiconductor circuit, a memory device, an imaging device, a display device, an electro-optical device, an electronic device, and the like are all semiconductor devices.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as integrated circuits (ICs) and electro-optical devices. In particular, transistors are urgently developed as switching elements of display devices typified by liquid crystal display devices and the like. In an active matrix liquid crystal display device, voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The range of uses of such an active matrix liquid crystal display device is expanding, and demands for larger screen size, higher definition, and higher aperture ratio are increasing. In addition, it is demanded that the active matrix liquid crystal display device have high reliability and that a production method of the active matrix liquid crystal display device offer high yield and reduce production cost.

In active matrix liquid crystal display devices, transistors are mainly used as switching elements. In manufacturing transistors, reduction in the number of photolithography steps is important for cost reduction. For example, one photomask for an eighth generation substrate costs tens of millions of yen, and one photomask for a tenth generation substrate or an eleventh generation substrate costs hundreds of millions of yen. Moreover, even when only one photolithography step is added in the manufacturing process, the number of steps relating to the photolithography step is significantly increased. Therefore, many techniques for reducing the number of photolithography steps have been developed.

Transistors are broadly classified into top-gate transistors, in which a channel formation region is provided below a gate electrode, and bottom-gate transistors, in which a channel formation region is provided above a gate electrode. These transistors are generally manufactured using at least five photomasks.

Many conventional techniques for reducing the number of photolithography steps use a complicated technique such as backside light exposure, resist reflow, or a lift-off method, which requires a special apparatus. Using such complicated techniques might cause various problems, thereby leading to reduction in yield. Moreover, there has often been no option but to sacrifice electric characteristics of transistors.

As typical means for reducing the number of photolithography steps in the manufacturing process of a thin film transistor, a technique using a multi-tone mask (also called a half-tone mask or a gray-tone mask) is widely known. As a known technique for reducing the number of manufacturing steps by using a multi-tone mask, Patent Document 1 is given, for example.

[Reference]

[Patent Document]

[Patent Document 1] Japanese Published Patent Application No. 2003-179069

SUMMARY OF THE INVENTION

An object is to reduce the number of photolithography steps in a manufacturing process of a semiconductor device. Further, an object is to manufacture a display device having high display quality.

A conductive film serving as a gate electrode of a transistor, an insulating film serving as a gate insulating film of the transistor, a semiconductor film in which a channel region of the transistor is formed, and an insulating film serving as a channel protective film of the transistor are successively formed, and a resist mask is formed thereover by performing light exposure with the use of a first photomask which is a multi-tone mask and development. A multi-tone mask is a mask capable of adjusting the amount of transmitting light in each region. Therefore, the thickness of a resist remaining in each region after development can be controlled by the amount of transmitting light. With the use of the thus formed resist mask having two regions with different thicknesses, i) in a region without the resist mask, the insulating film serving as a channel protective film, the semiconductor film in which a channel region is formed, the insulating film serving as a gate insulating film, and the conductive film serving as a gate electrode are successively etched, ii) the resist mask is made to recede by plasma treatment such as ashing and the region of the resist mask with smaller thickness is removed, so that part of the insulating film serving as a channel protective film is exposed, and iii) the exposed part of the insulating film serving as a channel protective film is etched so that an opening portion is formed. In other words, two kinds of resist masks can be obtained with the use of one photomask. Note that in this specification, "a resist mask is made to recede" means to reduce the area and the thickness of a resist mask.

Next, a conductive film is formed, and a resist mask is formed over the conductive film by performing light exposure with the use of a second photomask and development. The conductive film is processed with the use of the resist mask, so that electrodes serving as a source electrode and a drain electrode are formed.

Next, an interlayer insulating film is formed, and a resist mask is formed over the interlayer insulating film by performing light exposure with the use of a third photomask and development. The interlayer insulating film is processed with the use of the resist mask, so that opening portions which expose the electrodes are formed.

Next, a transparent conductive film is formed, and a resist mask is formed over the transparent conductive film by performing light exposure with the use of a fourth photomask and development. The transparent conductive film is processed with the use of the resist mask, so that a transparent conductive film which is in contact with the electrodes through the opening portions provided in the interlayer insulating film is formed. Through the above steps, a transistor can be manufactured.

Here, a capacitor portion, a gate wiring, and a source wiring of a display device can be formed concurrently in the steps of manufacturing the transistor.

The capacitor portion includes a capacitor wiring formed using the same material and in the same layer as the gate electrode, which also serves as a common wiring; an insulating film formed using the same material and in the same layer as the gate insulating film, which serves as a dielectric film; and a capacitor electrode formed using the same material and in the same layer as the transparent conductive film. Here, the dielectric film may include a semiconductor film formed using the same material and in the same layer as the semiconductor film and an insulating film formed using the same material and in the same layer as the channel protective film. Note that the number of layers included in the dielectric film is preferably smaller because the area occupied by the capacitor portion can be reduced when the dielectric film is made thinner, and the aperture ratio of the display device can be increased.

Further, the gate wiring can be formed using the same material and in the same layer as the gate electrode and the source wiring can be formed using the same material and in the same layer as the source electrode. Note that the gate electrode and the gate wiring are connected to each other. The source electrode and the source wiring are connected to each other through the transparent conductive film.

The transparent conductive film also serves as a pixel electrode of the display device.

Thus, a transistor of a display device can be manufacture with the use of four photomasks.

Note that in an intersection portion of the common wiring and the source wiring, the insulating film formed using the same material and in the same layer as the gate insulating film, the semiconductor film formed using the same material and in the same layer as the semiconductor film, and the insulating film formed using the same material and in the same layer as the channel protective film are preferably provided between the common wiring and the source wiring. With such a structure, parasitic capacitance in the intersection portion can be reduced. Thus, a display device in which the number of photolithography steps is reduced and display quality is high can be provided.

A transistor of a display device having high display quality can be manufactured with the use of four photomasks.

As compared to a conventional display device, the number of photolithography steps can be reduced, so that an increase in cost can be suppressed even when a larger substrate is used.

BRIEF DESCRIPTION OF THE DRAWINGS

In the accompanying drawings:

FIGS. 4A to 4C are cross-sectional views illustrating a method for manufacturing a semiconductor device according to one embodiment of the present invention;

DETAILED DESCRIPTION OF THE INVENTION

Figure 1A:
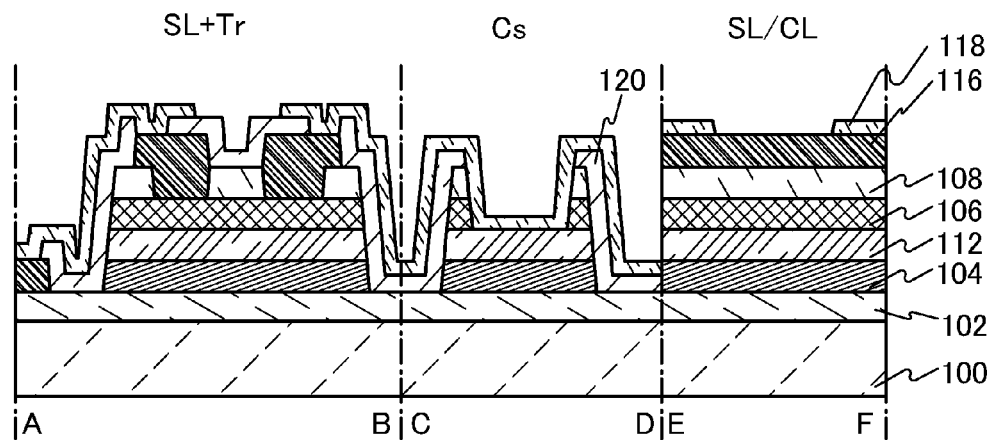
FIGS. 1A and 1B are a cross-sectional view and a top view of a semiconductor device according to one embodiment of the present invention.

Hereinafter, embodiments of the present invention will be described in detail with reference to the accompanying drawings. However, the present invention is not limited to the description below, and it is easily understood by those skilled in the art that modes and details thereof can be modified in various ways. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Note that in this specification, a pixel transistor is illustrated as a transistor for explaining a semiconductor device in some cases; however, the present invention is not limited thereto. The semiconductor device that is one embodiment of the present invention may be a transistor other than the pixel transistor.

(Embodiment 1)

First, a semiconductor device (a transistor and a capacitor portion of a display device) which is one embodiment of the present invention will be described with reference to FIGS. 1A and 1B, FIGS. 2A to 2C, FIGS. 3A to 3C, FIGS. 4A to 4C, FIGS. 5A to 5C, FIGS. 6A to 6C, FIGS. 7A to 7C, FIGS. 10A and 10B, and FIGS. 17A and 17B. A source wiring SL and a transistor Tr, a capacitor portion Cs, and an intersection portion of the source wiring SL and a common wiring CL (also serving as a capacitor wiring) will be described in parallel with reference to FIGS. 1A and 1B, FIGS. 2A to 2C, FIGS. 3A to 3C, FIGS. 4A to 4C, FIGS. 5A to 5C, FIGS. 6A to 6C, FIGS. 7A to 7C, FIGS. 10A and 10B, and FIGS. 17A and 17B.

Figure 1B:
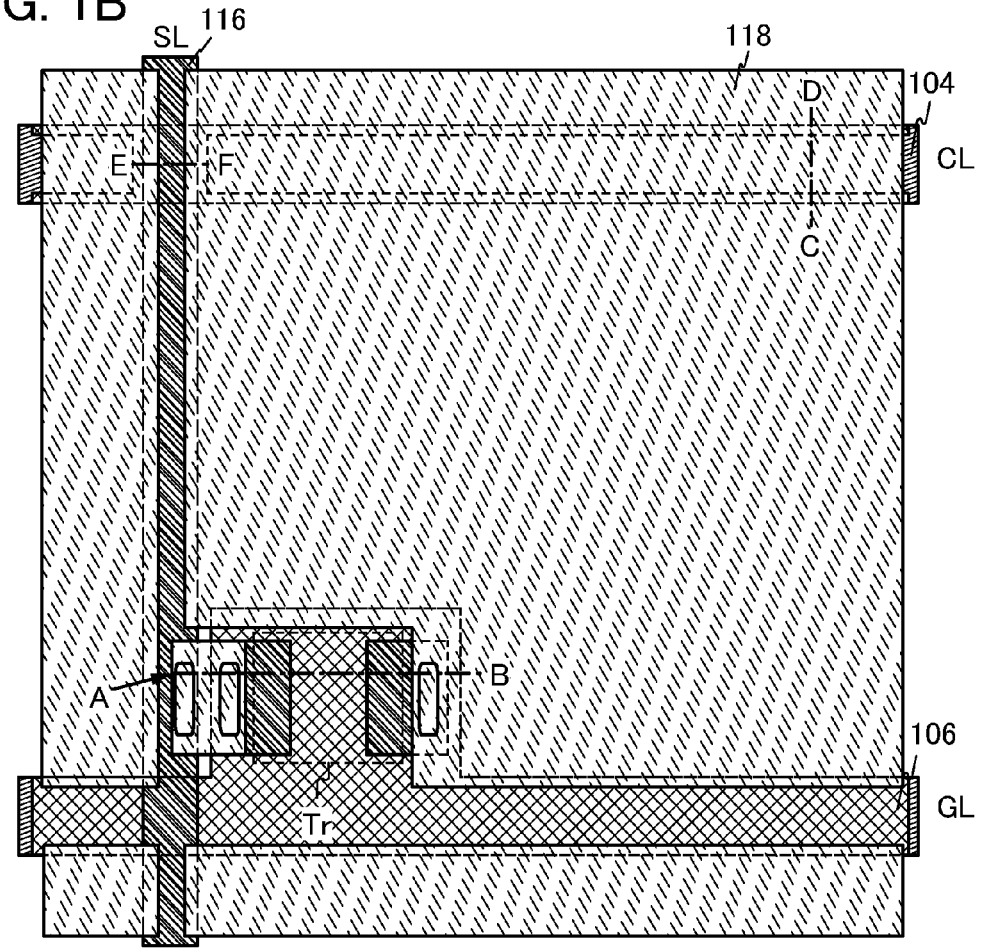

FIGS. 1A and 1B are a cross-sectional view and a top view of a semiconductor device manufactured in this embodiment. FIG. 1A illustrates cross sections A-B, C-D, and E-F along dashed lines A-B, C-D, and E-F in FIG. 1B. Note that some films are omitted in FIG. 1B for simplification.

First, FIG. 1A is described.

The cross-section A-B in FIG. 1A illustrates a region where the transistor Tr and the source wiring SL are formed. The region includes a substrate 100; a first insulating film 102 over the substrate 100; a first conductive film 104, a second insulating film 112, a semiconductor film 106, and a third insulating film 108 in which a pair of opening portions which expose the semiconductor film 106 is provided, which are over the first insulating film 102; a second conductive film 116 which is in contact with the semiconductor film 106 through the pair of opening portions; a fourth insulating film 120 which covers the first insulating film 102, the first conductive film 104, the second insulating film 112, the semiconductor film 106, the third insulating film 108, and the second conductive film 116, and in which an opening portion which exposes the second conductive film 116 is provided; and a third conductive film 118 which is in contact with the second conductive film 116 through the opening portion. Outer circumferences of the first conductive film 104, the second insulating film 112, the semiconductor film 106, and the third insulating film 108 are substantially the same. The source wiring SL is formed using the same material and in the same layer as the second conductive film 116. The structure is described in which a source electrode or a drain electrode of the transistor Tr, which is formed using the same material and in the same layer as the second conductive film 116, is connected to the source wiring SL through the third conductive film 118; however, the structure is not limited thereto. The source electrode or the drain electrode of the transistor Tr may be extended to serve as the source wiring SL.

In this specification, "outer circumferences of films are substantially aligned" means that outlines of films are substantially aligned as seen from the above, including the case where an end portion of one film is aligned with an end portion of another film, the case where an end portion of one film is recessed with respect to an end portion of another film, and the case where tapered shapes of end portions of films are different from each other.

The cross section C-D in FIG. 1A illustrates the capacitor portion Cs including the substrate 100; the first insulating film 102 over the substrate 100; the first conductive film 104, the second insulating film 112, the semiconductor film 106, and the third insulating film 108 over the first insulating film 102; the fourth insulating film 120 over the first insulating film 102, the first conductive film 104, the second insulating film 112, the semiconductor film 106, and the third insulating film 108; and the third conductive film 118 which is in contact with the second insulating film 112 through an opening portion provided in the semiconductor film 106, the third insulating film 108, and the fourth insulating film 120. Outer circumferences of the first conductive film 104, the second insulating film 112, the semiconductor film 106, and the third insulating film 108 are substantially aligned.

In the capacitor portion Cs, the first conductive film 104 serves as a first capacitor electrode and a capacitor wiring, the second insulating film 112 serves as a dielectric film, and the third conductive film 118 serves as a second capacitor electrode. The second capacitor electrode which is the third conductive film 118 is connected to the second conductive film 116 which serves as the source electrode or the drain electrode of the transistor Tr through the opening portion provided in the fourth insulating film 120.

Note that an electrode formed using the same material and in the same layer as the second conductive film 116 may be used as the second capacitor electrode. The resistance of the second conductive film 116 can be smaller than that of the third conductive film 118, so that accumulation of charge in the capacitor portion Cs can be performed quickly.

Although only the case where the second insulating film 112 is used as a dielectric film is described, the dielectric film is not limited thereto. As the dielectric film, a semiconductor film formed using the same material and in the same layer as the semiconductor film 106 or an insulating film formed using the same material and in the same layer as the third insulating film 108 may be included. Note that when the dielectric film has a stacked structure, capacitance per unit area is smaller than that in the case where a single layer of the second insulating film 112 is used; therefore, the area of a capacitor wiring needs to be increased. On the other hand, when the dielectric film includes only the second insulating film 112, capacitance per unit area can be increased, so that a display device having a high aperture ratio can be manufactured.

The cross section E-F in FIG. 1A illustrates the intersection portion of the common wiring CL and the source wiring SL, including the substrate 100; the first insulating film 102 over the substrate 100; the first conductive film 104, which serves as the common wiring CL, over the first insulating film 102; the second insulating film 112 over the first conductive film 104; the semiconductor film 106 over the second insulating film 112; the third insulating film 108 over the semiconductor film 106; the second conductive film 116, which serves as the source wiring SL, over the third insulating film 108; and the divided third conductive films 118 over the second conductive film 116.

In the intersection portion of the common wiring CL and the source wiring SL, an insulating film formed using the same material and in the same layer as the second insulating film 112, a semiconductor film formed using the same material and in the same layer as the semiconductor film 106, and an insulating film formed using the same material and in the same layer as the third insulating film 108 are provided between the wirings, so that parasitic capacitance in the intersection portion can be reduced. When parasitic capacitance in the intersection portion of the common wiring CL and the source wiring SL is reduced, a display device having high display quality can be obtained.

Although not illustrated, an intersection portion of a gate wiring GL and the source wiring SL has a cross-sectional structure similar to that of the intersection portion of the common wiring CL and the source wiring SL.

Figure 10A:
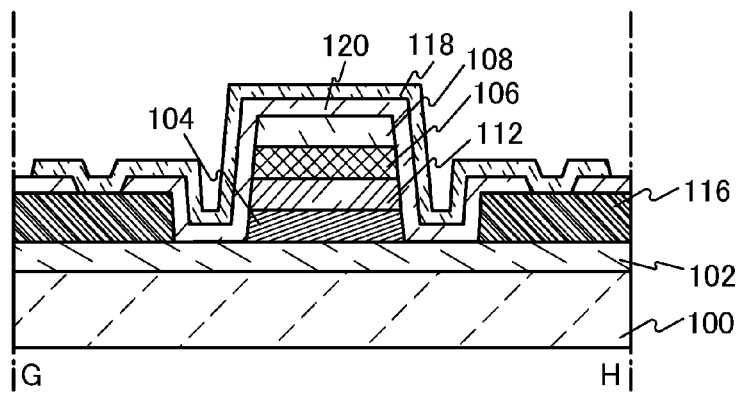
FIGS. 10A and 10B are a cross-sectional view and a top view of a semiconductor device according to one embodiment of the present invention.
Figure 10B:
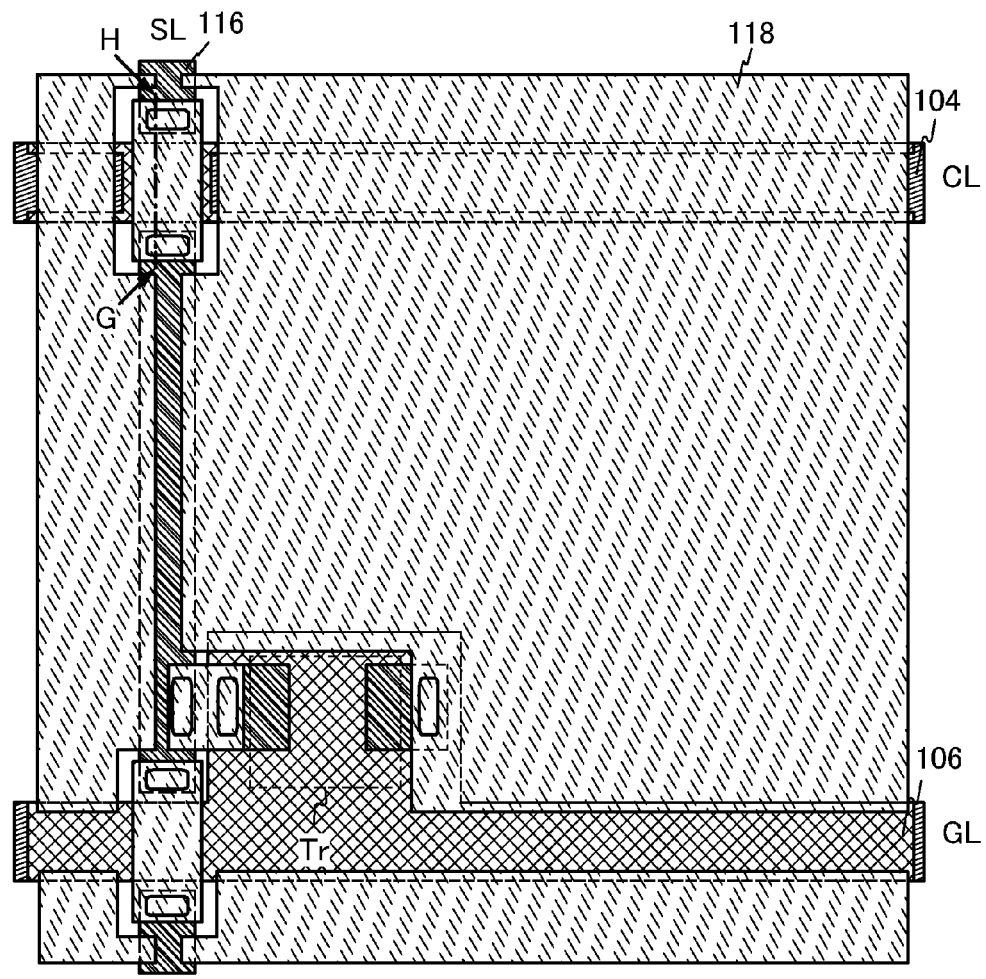

The intersection portion of the common wiring CL and the source wiring SL may have a structure illustrated in FIGS. 10A and 10B. FIG. 10A illustrates a cross section G-H along a dashed line G-H in FIG. 10B. The second conductive films 116 which are parts of the source wiring SL are connected to each other through the third conductive film 118. At this time, the third conductive film 118 intersects with the common wiring CL with at least the fourth insulating film 120 interposed therebetween. With such a structure, parasitic capacitance in the intersection portion of the wirings can be further reduced, which is preferable. Note that the third conductive film 118 may collectively cross over the common wiring CL and the gate wiring GL with at least the fourth insulating film 120 interposed between the third conductive film 118 and the common wiring CL and the gate wiring GL by providing the common wiring CL and the gate wiring GL close to each other.

There is no particular limitation on the substrate 100 as long as the substrate 100 has heat resistance enough to withstand at least heat treatment to be performed later. For example, a glass substrate, a ceramic substrate, a quartz substrate, a sapphire substrate, or the like may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates further provided with a semiconductor element may be used as the substrate 100.

A flexible substrate may alternatively be used as the substrate 100. In that case, a transistor is formed directly on the flexible substrate. Note that as a method for forming a transistor over a flexible substrate, there is also a method in which, after a non-flexible substrate is used as the substrate 100 and a transistor is formed thereover, the transistor is separated from the substrate and transferred to a flexible substrate. In that case, a separation layer is preferably provided between the substrate 100 and the transistor.

The first insulating film 102 may be formed with a single layer or a stacked layer using a film containing any of gallium oxide, zinc gallium oxide, tin oxide, tin zinc oxide, aluminum oxide, hafnium oxide, zirconium oxide, yttrium oxide, tantalum oxide, silicon oxide, silicon oxynitride, silicon nitride oxide, and silicon nitride. In particular, a film containing a metal oxide such as gallium oxide, zinc gallium oxide, tin oxide, tin zinc oxide, aluminum oxide, hafnium oxide, zirconium oxide, yttrium oxide, or tantalum oxide is not easily affected in dry etching and wet etching and has a favorable function as an etch stop film. Since the first insulating film 102 does not directly contribute to the operation of the semiconductor device, the first insulating film 102 is not necessarily provided.

In this specification, silicon oxynitride refers to a substance that contains more oxygen than nitrogen. For example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. Further, silicon nitride oxide refers to a substance that contains more nitrogen than oxygen. For example, silicon nitride oxide contains oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are ranges for cases where measurement is performed using Rutherford backscattering spectrometry (RBS) and hydrogen forward scattering spectrometry (HFS). Moreover, the total of the percentages of the constituent elements does not exceed 100 atomic %.

The first conductive film 104 may be formed using a material containing aluminum, titanium, vanadium, chromium, cobalt, nickel, copper, zirconium, molybdenum, silver, tantalum, or tungsten.

When copper is used for the first conductive film 104, resistance of the common wiring CL and the gate wiring GL can be reduced, so that occurrence of wiring delay or the like can be reduced even in a large display device. In the case where copper is used for the first conductive film 104, adhesion might become worse depending on a material of the substrate 100; therefore, it is preferable to use a stacked structure of a copper film and a film having favorable adhesion to the substrate 100. A film containing titanium, molybdenum, manganese, copper, aluminum, or the like may be used as the film having favorable adhesion to the substrate 100. For example, a copper-manganese-aluminum alloy film may be used. Note that the first conductive film 104 can also be used as part of the source wiring SL. In that case, the first conductive film 104 and the second conductive film 116 need to be connected to each other through the third conductive film 118. The first conductive film 104 and the second conductive film 116 can be connected to each other at any point in the semiconductor device. In the case of providing a protective circuit, for example, it is preferable for circuit design that the first conductive film 104 and the second conductive film 116 be connected to each other around the protective circuit.

The semiconductor film 106 is preferably formed using a silicon film, a germanium film, a silicon germanium film, a silicon carbide film, a gallium nitride film, or an oxide semiconductor film.

For example, for the oxide semiconductor film used as the semiconductor film 106, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. In addition, any of the above materials may contain silicon oxide. Here, for example, an In—Ga—Zn—O-based material means oxide containing indium (In), gallium (Ga), and zinc (Zn), and there is no particular limitation on the composition ratio thereof. Further, the In—Ga—Zn—O-based material may contain an element other than In, Ga, and Zn.

Alternatively, a material represented by a chemical formula, $InMO_3(ZnO)_m$ (m>0) may be used as the oxide semiconductor film. Here, M represents one or more metal elements selected from Ga, Al, Mn, and Co. For example, M may be Ga, Ga and Al, Ga and Mn, Ga and Co, or the like.

Further, the oxide semiconductor film may include an oxide including a crystal with c-axis alignment (also referred to as c-axis aligned crystal (CAAC)), which has neither a single crystal structure nor an amorphous structure.

The second insulating film 112 and the third insulating film 108 are preferably composed of materials similar to that of the first insulating film 102. Alternatively, in the case where an oxide semiconductor film is used as the semiconductor film 106, a film from which oxygen is released by heating may be used. Further alternatively, in the case where the material of the first conductive film 104 might diffuse into the semiconductor film 106 to adversely affect transistor characteristics, an insulating film having small diffusion coefficient of the material of the first conductive film 104 may be used. The third insulating film 108 serves as a protective film of the semiconductor film 106.

"Oxygen is released by heating" means that the amount of released oxygen which is converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS).

Here, a method in which the amount of released oxygen is measured by being converted into oxygen atoms using TDS analysis will be described below.

The amount of released gas in TDS analysis is proportional to the integral value of a spectrum. Therefore, the amount of released gas can be calculated from the ratio between the integral value of a measured spectrum and the reference value of a standard sample. The reference value of a standard sample refers to the ratio of the density of a predetermined atom contained in a sample to the integral value of a spectrum.

For example, the number of the released oxygen molecules ($N_{O2}$) from an insulating film can be found according to Equation 1 with the TDS analysis results of a silicon wafer containing hydrogen at a predetermined density which is the standard sample and the TDS analysis results of the insulating film. Here, all spectra having a mass number of 32 which are obtained by the TDS analysis are assumed to originate from an oxygen molecule. CH$_3$OH, which is given as a gas having a mass number of 32, is not taken into consideration on the assumption that it is unlikely to be present. Further, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha \quad \text{(Equation 1)}$$

$N_{H2}$ is the value obtained by conversion of the number of hydrogen molecules desorbed from the standard sample into density. $S_{H2}$ is the integral value of a spectrum when the standard sample is subjected to TDS analysis. Here, the reference value of the standard sample is set to $N_{H2}/S_{H2}$. $S_{O2}$ is the integral value of a spectrum when the insulating film is subjected to TDS analysis. $\alpha$ is a coefficient which influences spectrum intensity in TDS analysis. Refer to Japanese Published Patent Application No. H6-275697 for details of Equation 1. Note that the amount of released oxygen from the above insulating film is measured with a thermal desorption spectroscopy apparatus produced by ESCO Ltd., EMD-WA1000S/W using a silicon wafer containing a hydrogen atom at $1 \times 10^{16}$ atoms/cm$^3$ as the standard sample.

Further, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the number of the released oxygen atoms can also be estimated through the evaluation of the number of the released oxygen molecules.

Note that $N_{O2}$ is the number of the released oxygen molecules. The amount of released oxygen when converted into oxygen atoms is twice the number of the released oxygen molecules.

In the above structure, the film from which oxygen is released by heating may be oxygen-excess silicon oxide (SiO$_x$(X>2)). In the oxygen-excess silicon oxide (SiO$_x$(X>2)), the number of oxygen atoms per unit volume is more than twice the number of silicon atoms per unit volume. The number of silicon atoms and the number of oxygen atoms per unit volume are measured by Rutherford backscattering spectrometry.

Oxygen is supplied to the semiconductor film 106 which is an oxide semiconductor film from the second insulating film 112 or the third insulating film 108, so that the interface state density between the second insulating film 112 or the third insulating film 108 and the semiconductor film 106 which is an oxide semiconductor film can be reduced. As a result, charge or the like, which is generated due to the operation of the transistor or the like, can be prevented from being trapped at the interface between the second insulating film 112 or the third insulating film 108 and the semiconductor film 106 which is an oxide semiconductor film, so that the transistor Tr with little degradation of electric characteristics can be obtained.

Further, in some cases, charge is generated due to oxygen deficiency in the oxide semiconductor film. In general, part of oxygen deficiency in an oxide semiconductor film serves as a donor to generate an electron which is a carrier. As a result, the threshold voltage of a transistor shifts in the negative direction. Oxygen is sufficiently supplied from the second insulating film 112 or the third insulating film 108 to the semiconductor film 106 which is an oxide semiconductor film, whereby oxygen deficiency density in the oxide semiconductor film which causes the negative shift of the threshold voltage can be reduced.

In other words, when a film from which oxygen is released by heating is provided as the second insulating film 112 or the third insulating film 108, the interface state density at the interface between the semiconductor film 106 and the second insulating film 112 or the interface state density at the interface between the semiconductor film 106 and the third insulating film 108, and the oxygen deficiency density of the semiconductor film 106 which is an oxide semiconductor film can be reduced, and the influence of carrier trapping at the interface between the semiconductor film 106 which is an oxide semiconductor film and the second insulating film 112 or the third insulating film 108 can be reduced.

The second conductive film 116 is preferably composed of a material similar to that of the first conductive film 104. When copper is used for the second conductive film 116, resistance of the source wiring can be reduced, so that occurrence of wiring delay or the like can be reduced even in a large display device. In the case where copper is used for the second conductive film 116, adhesion might become worse depending on a material of the film serving as a base; therefore, it is preferable to use a stacked structure including a copper film and a film having favorable adhesion to the film serving as a base. For example, a film containing titanium, molybdenum, manganese, copper, aluminum, or the like is preferably used as the film having favorable adhesion to the film serving as a base. Further, a stacked structure including a metal nitride film may be used in order to prevent copper from diffusing into the semiconductor film 106. Titanium nitride, chromium nitride, molybdenum nitride, tantalum nitride, or tungsten nitride may be used for the metal nitride film.

The fourth insulating film 120 is preferably composed of a material similar to that of the first insulating film 102.

The third conductive film 118 is preferably formed using a light-transmitting conductive film including indium oxide, zinc oxide, tin oxide, aluminum oxide, silicon oxide, titanium oxide, gallium oxide, tungsten oxide, or a mixture thereof. For example, indium tin oxide (also referred to as ITO) which is a mixture of indium oxide and tin oxide may be used. Note that ITO is easily crystallized by heat treatment or the like and might decrease the reliability of a semiconductor device.

Therefore, it is preferable to use a material in which ITO is mixed with silicon oxide for preventing crystallization of ITO.

Depending on the structure of a display device, the third conductive film 118 is not necessarily a light-transmitting film. For example, the third conductive film 118 may be formed using the same material as that of the first conductive film 104.

Note that the third conductive film 118 serves as a pixel electrode of a display device.

Next, a method for manufacturing the semiconductor device illustrated in FIGS. 1A and 1B is described.

Figure 2A:
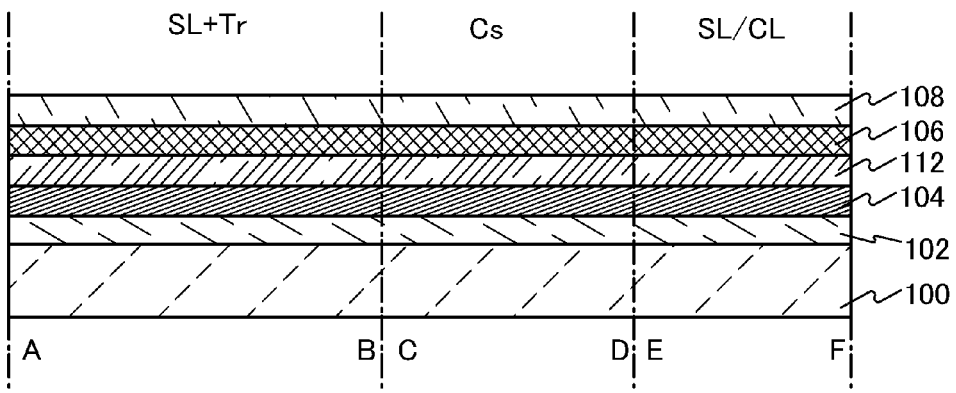
FIGS. 2A to 2C are cross-sectional views illustrating a method for manufacturing a semiconductor device according to one embodiment of the present invention.
Figure 2B:
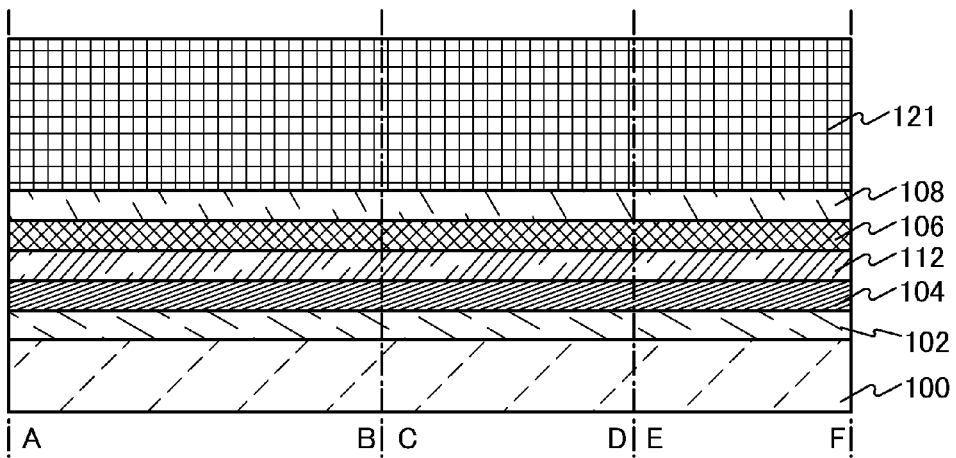
Figure 2C:
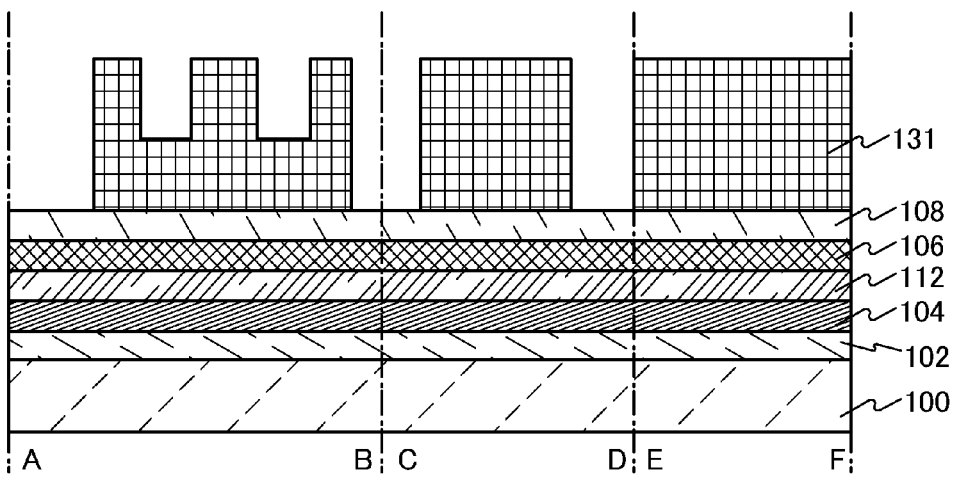

First, over the substrate 100, the first insulating film 102, the first conductive film 104, the second insulating film 112, the semiconductor film 106, and the third insulating film 108 are formed successively without exposure to the air (see FIG. 2A).

When the first insulating film 102 to the third insulating film 108 are formed successively without exposure to the air, contamination of the interface between the films can be prevented, which is preferable. Specifically, in the case where the interface between the semiconductor film 106 and the third insulating film 108 is contaminated, the electric characteristics and the reliability of the transistor Tr might be degraded.

The first insulating film 102, the first conductive film 104, the second insulating film 112, the semiconductor film 106, and the third insulating film 108 are formed by a film formation method such as a sputtering method, a molecular beam epitaxy (MBE) method, a chemical vapor deposition (CVD) method, a pulse laser deposition method, or an atomic layer deposition (ALD) method.

A resist 121 is applied over the third insulating film 108 (see FIG. 2B), exposed to light with the use of a first photomask which is a multi-tone mask, and developed to form a resist mask 131. Since the resist mask 131 is formed by performing light exposure with the use of the multi-tone mask and development, the resist mask 131 has a region without a resist, a region with a thin resist (also referred to as a region with a first thickness), and a region with a thick resist (also referred to as a region with a second thickness) (see FIG. 2C).

The third insulating film 108, the semiconductor film 106, the second insulating film 112, and the first conductive film 104 are etched with the use of the resist mask 131. The shape of the resist mask 131 is also changed by the etching treatment and a resist mask 141 is formed (see FIG. 3A).

Figure 3A:
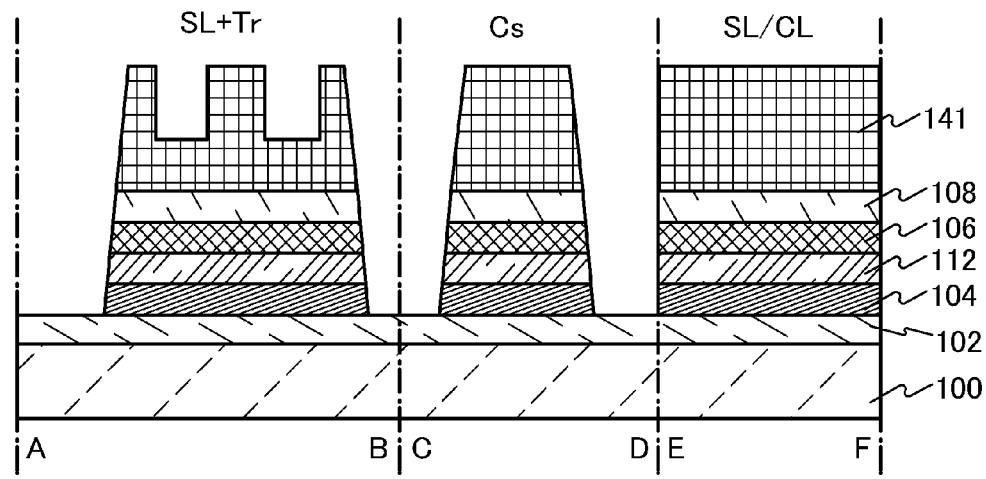
FIGS. 3A to 3C are cross-sectional views illustrating a method for manufacturing a semiconductor device according to one embodiment of the present invention.
Figure 3B:
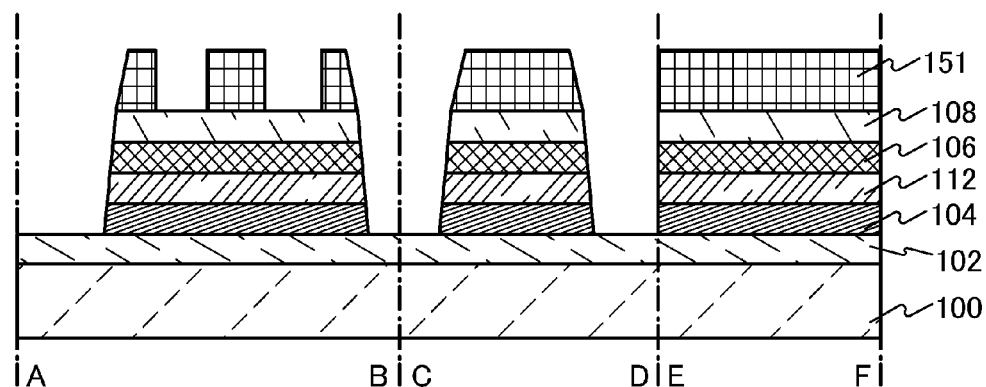
Figure 3C:
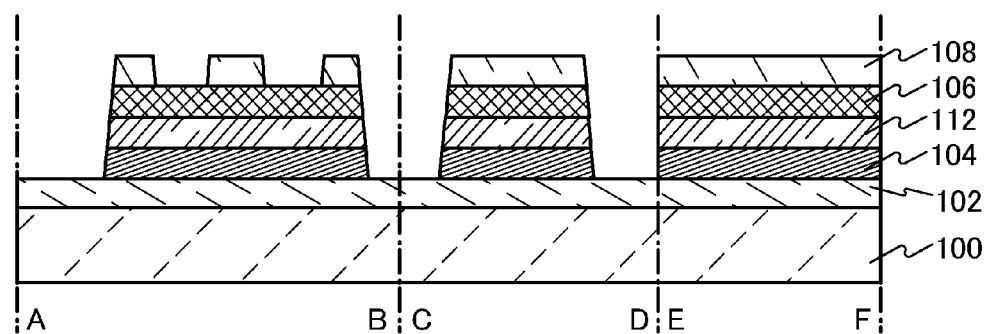

The resist mask 141 is made to recede by plasma treatment such as ashing until the region with a thin resist is removed; thus, a resist mask 151 is formed (see FIG. 3B). At this time, an exposed sidewall of the first conductive film 104 may be oxidized by the plasma treatment such as ashing and may be covered with an insulator 114 (see FIG. 17A). When the exposed sidewall of the first conductive film 104 is oxidized, the source wiring SL to be formed later is prevented from being electrically connected to side surfaces of the gate wiring GL and the common wiring CL, which are formed using the same material and in the same layer as the first conductive film 104. Note that in order to oxidize the sidewall of the first conductive film 104, plasma treatment using an oxidizing gas may be solely performed, or may be performed in addition to ashing. For example, as the oxidizing gas, oxygen, ozone, nitrogen oxide, or the like may be used.

The third insulating film 108 is etched with the use of the resist mask 151. Then, the resist mask 151 is removed (see FIG. 3C). At this time, the substrate 100 can be prevented from being etched due to the first insulating film 102.

Next, the second conductive film 116 is formed by a film formation method such as a sputtering method, an MBE method, a CVD method, a pulse laser deposition method, or an ALD method (see FIG. 4A).

A resist 122 is applied over the second conductive film 116 (see FIG. 4B), exposed to light with the use of a second photomask, and developed to form a resist mask 132 (see FIG. 4C).

The second conductive film 116 is etched with the use of the resist mask 132. Then, the resist mask 132 is removed (see FIG. 5A).

Figure 5A:
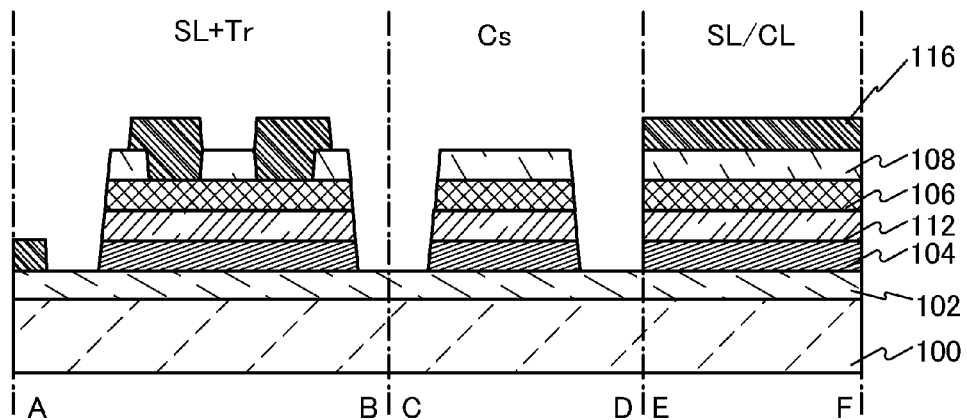
FIGS. 5A to 5C are cross-sectional views illustrating a method for manufacturing a semiconductor device according to one embodiment of the present invention.
Figure 5B:
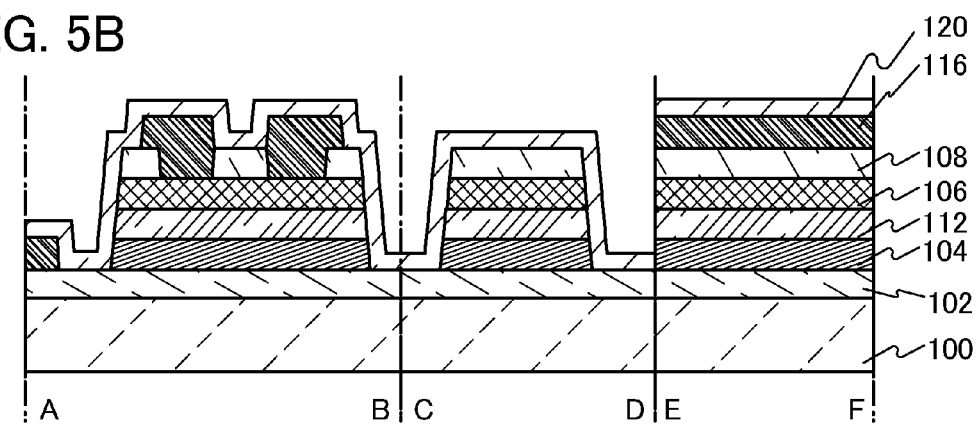
Figure 5C:
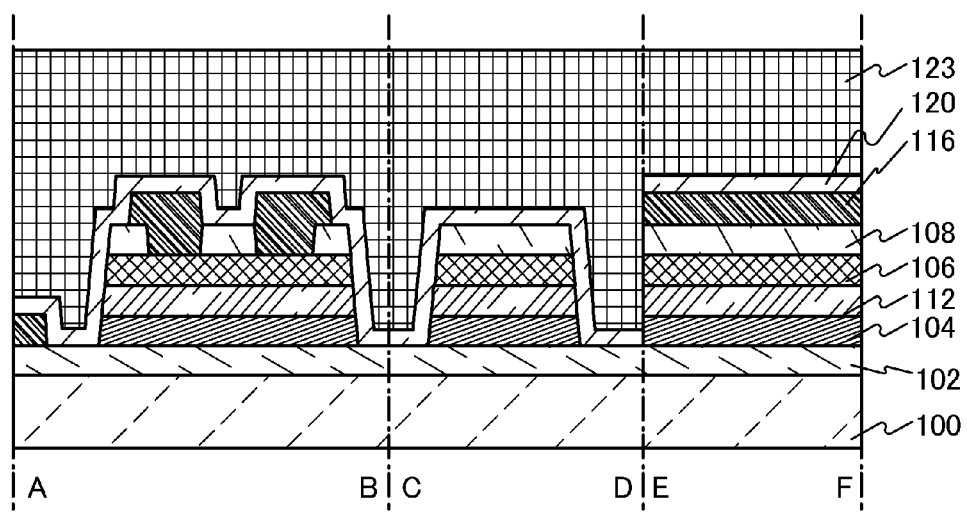

Next, the fourth insulating film 120 is formed by a film formation method such as a sputtering method, an MBE method, a CVD method, a pulse laser deposition method, or an ALD method (see FIG. 5B).

Figure 6A:
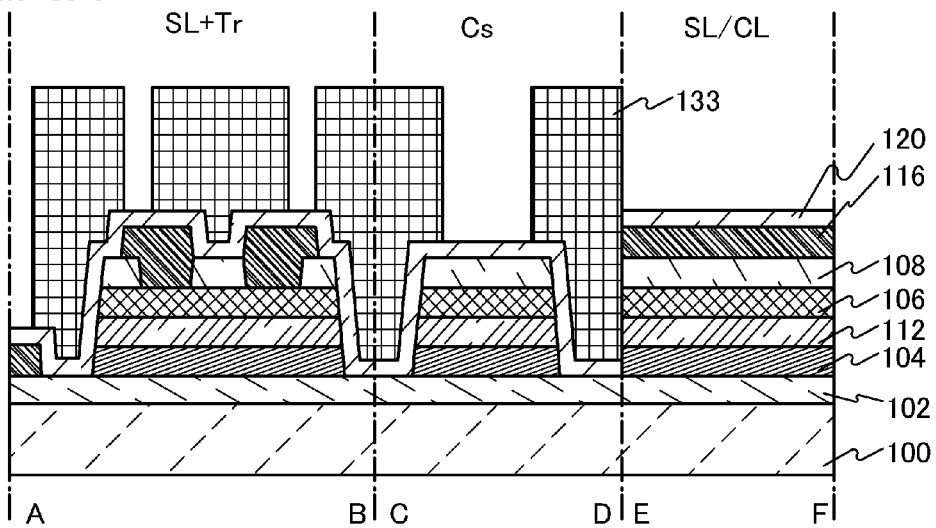
FIGS. 6A to 6C are cross-sectional views illustrating a method for manufacturing a semiconductor device according to one embodiment of the present invention.
Figure 6B:
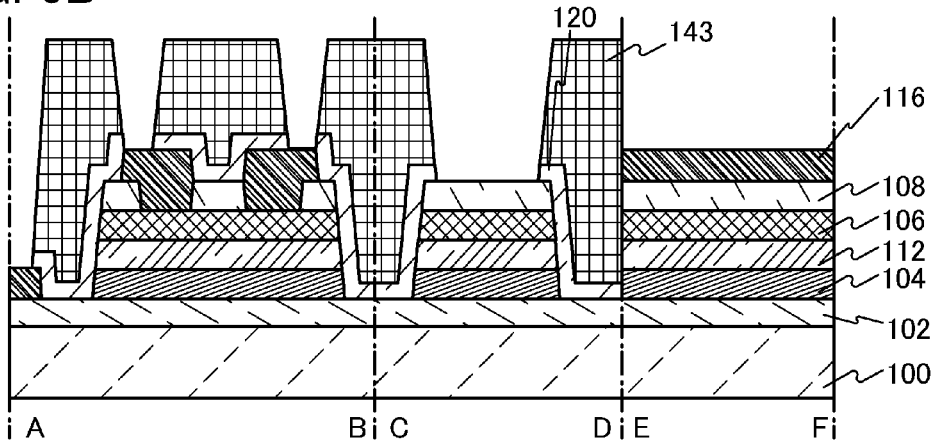
Figure 6C:
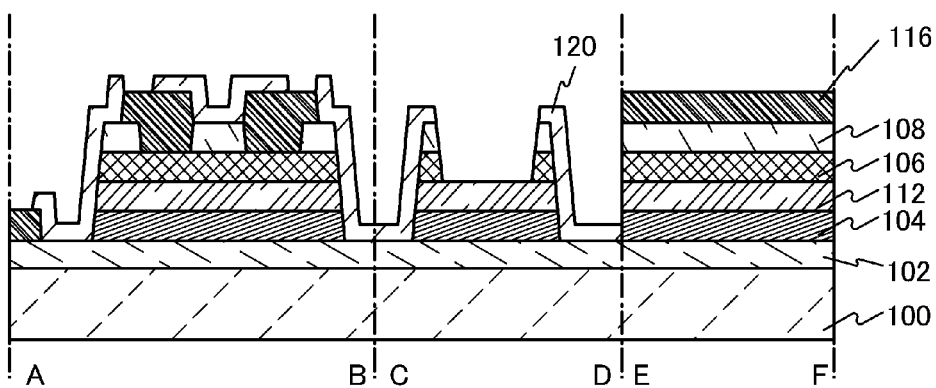

A resist 123 is applied over the fourth insulating film 120 (see FIG. 5C), exposed to light with the use of a third photomask, and developed to form a resist mask 133 (see FIG. 6A).

The fourth insulating film 120 is etched with the use of the resist mask 133. The shape of the resist mask 133 is also changed by the etching treatment and a resist mask 143 is formed (see FIG. 6B).

The third insulating film 108 and the semiconductor film 106 are etched with the use of the resist mask 143. Then, the resist mask 143 is removed (see FIG. 6C). At this time, the third insulating film 108 and the semiconductor film 106 are preferably etched under such conditions that the etching rate of the second conductive film 116 is lower than the etching rates of the third insulating film 108 and the semiconductor film 106.

Note that in the capacitor portion Cs, it is not necessary to etch all of the fourth insulating film 120, the third insulating film 108, and the semiconductor film 106. Note that in order to reduce the area occupied by the capacitor portion Cs in a display device, it is preferable that the fourth insulating film 120, the third insulating film 108, and the semiconductor film 106 be etched and capacitance per unit area of the capacitor portion Cs be increased.

Figure 7A:
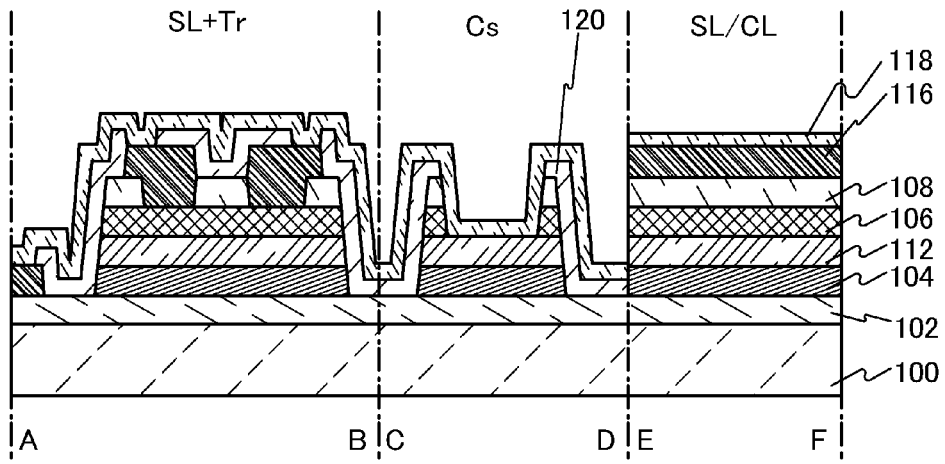
FIGS. 7A to 7C are cross-sectional views illustrating a method for manufacturing a semiconductor device according to one embodiment of the present invention.
Figure 7B:
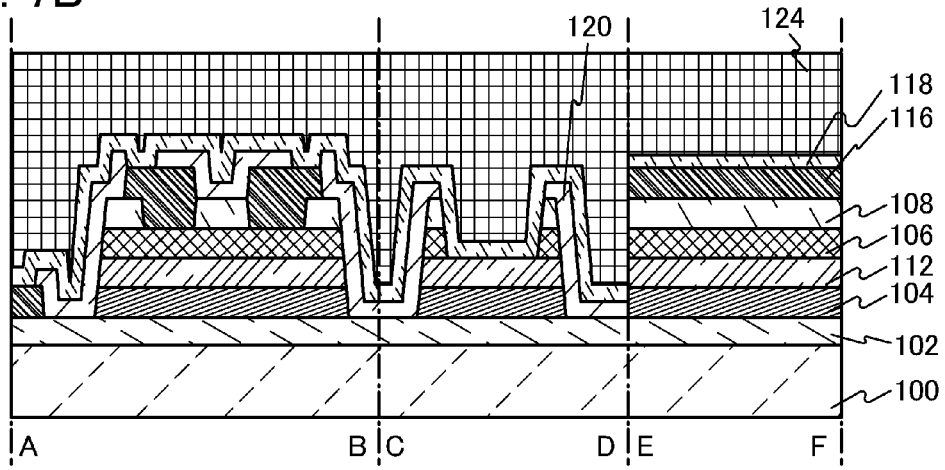

Next, the third conductive film 118 having light transmitting property is formed by a film formation method such as a sputtering method, an MBE method, a CVD method, a pulse laser deposition method, or an ALD method (see FIG. 7A).

Figure 7C:
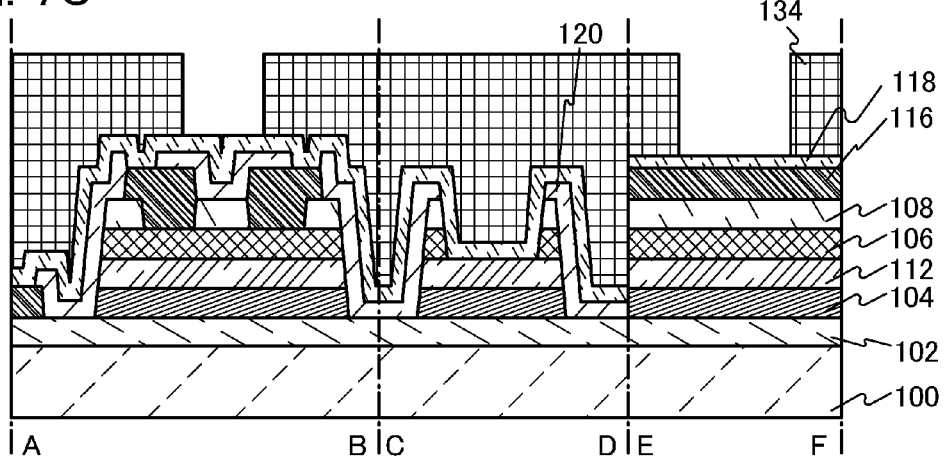

A resist 124 is applied over the third conductive film 118 (see FIG. 7B), exposed to light with the use of a fourth photomask, and developed to form a resist mask 134 (see FIG. 7C).

The third conductive film 118 is etched with the use of the resist mask 134, and then, the resist mask 134 is removed. Thus, the semiconductor device illustrated in FIGS. 1A and 1B is manufactured. Note that in the case where the sidewalls of the gate wiring GL and the common wiring CL are covered with the insulators 114, the semiconductor device has a cross-sectional structure illustrated in FIG. 17B.

Through the above steps, the transistor Tr, the capacitor portion Cs, and the intersection portion of the common wiring CL and the source wiring SL of the semiconductor device can be manufactured with the use of four photomasks.

By employing the semiconductor device described in this embodiment, a display device having a high aperture ratio and high display quality can be manufactured.

This embodiment can be implemented in appropriate combination with any of the other embodiments.

(Embodiment 2)

In this embodiment, a semiconductor device (a transistor and a capacitor portion of a display device) having a structure different from that described in Embodiment 1 will be described with reference to FIGS. 11A and 11B, FIGS. 12A and 12B, FIGS. 13A and 13B, and FIGS. 14A to 14C. The source wiring SL and the transistor Tr, a connection portion of a common electrode CE and the common wiring CL, and the capacitor portion Cs will be described in parallel with reference to FIGS. 11A and 11B, FIGS. 12A and 12B, FIGS. 13A and 13B, and FIGS. 14A to 14C.

In this embodiment, a semiconductor device which can be applied to a liquid crystal display device of an in-plane switching (IPS) mode which is a kind of horizontal electric field modes will be described.

Figure 11A:
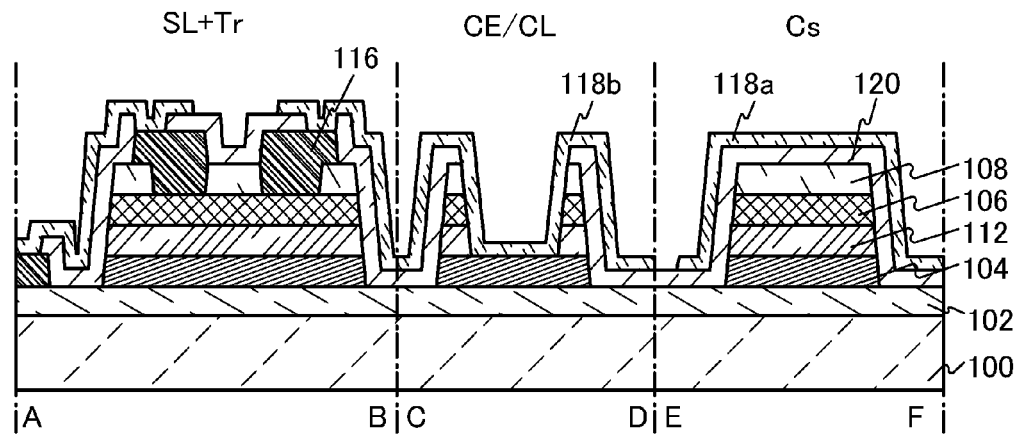
FIGS. 11A and 11B are a cross-sectional view and a top view of a semiconductor device according to one embodiment of the present invention.
Figure 11B:
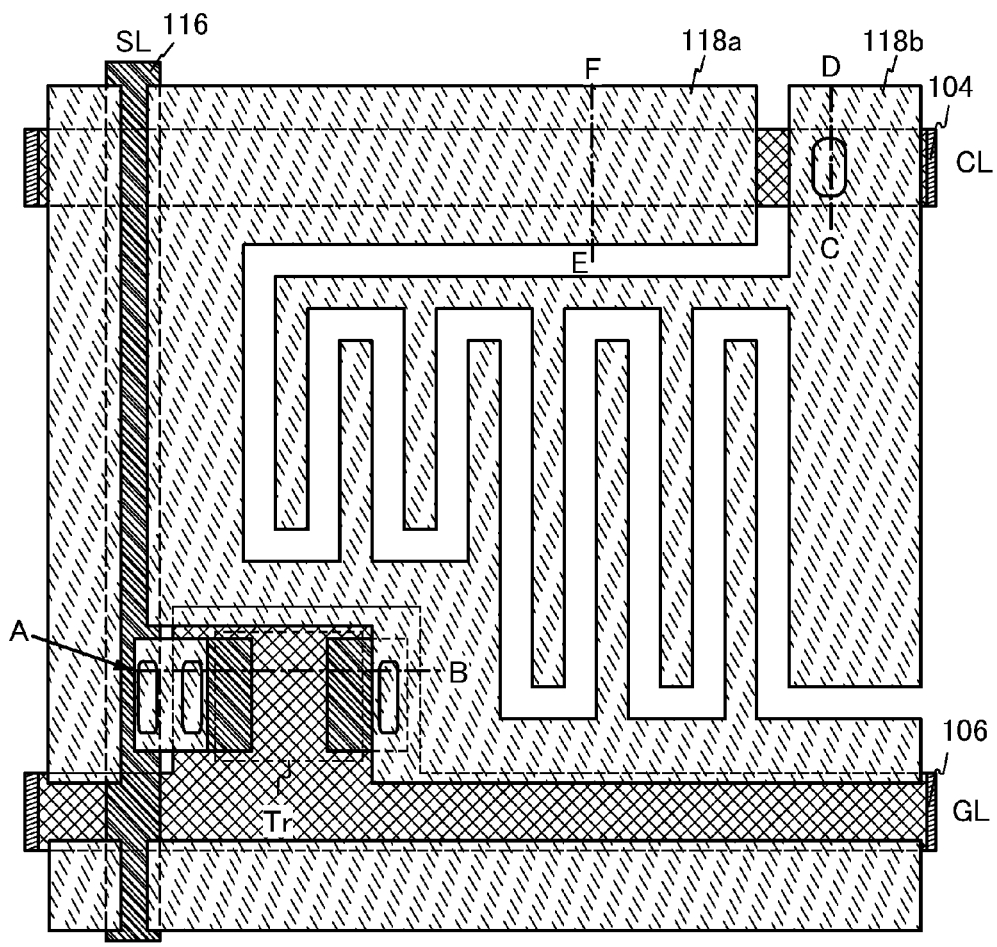

FIGS. 11A and 11B are a cross-sectional view and a top view of a display device manufactured in this embodiment. FIG. 11A illustrates cross sections A-B, C-D, and E-F along dashed lines A-B, C-D, and E-F in FIG. 11B. Note that some films are omitted in FIG. 11B for simplification.

The cross section A-B in FIG. 11A may be a structure similar to that of the cross section A-B in FIG. 1A.

The cross section C-D in FIG. 11A illustrates the connection portion of the common electrode CE and the common wiring CL. The connection portion includes the substrate 100; the first insulating film 102 over the substrate 100; the first conductive film 104, the second insulating film 112, the semiconductor film 106, and the third insulating film 108, which are over the first insulating film 102; the fourth insulating film 120 over the first insulating film 102, the first conductive film 104, the second insulating film 112, the semiconductor film 106, and the third insulating film 108; and a third conductive film 118b which is in contact with the first conductive film 104 through an opening portion provided in the second insulating film 112, the semiconductor film 106, the third insulating film 108, and the fourth insulating film 120. Outer circumferences of the first conductive film 104, the second insulating film 112, the semiconductor film 106, and the third insulating film 108 are substantially aligned. Here, the third conductive film 118b is the common electrode CE.

The cross section E-F in FIG. 11A illustrates the capacitor portion Cs. The capacitor portion Cs includes the substrate 100; the first insulating film 102 over the substrate 100; the first conductive film 104, the second insulating film 112, the semiconductor film 106, and the third insulating film 108, which are over the first insulating film 102; the fourth insulating film 120 over the first insulating film 102, the first conductive film 104, the second insulating film 112, the semiconductor film 106, and the third insulating film 108; and a third conductive film 118a which covers the fourth insulating film 120. Outer circumferences of the first conductive film 104, the second insulating film 112, the semiconductor film 106, and the third insulating film 108 are substantially aligned.

In the capacitor portion Cs, the first conductive film 104 serves as a first capacitor electrode and the common wiring CL, the second insulating film 112, the semiconductor film 106, and the third insulating film 108 serve as dielectric films, and the third conductive film 118a serves as a second capacitor electrode. The second capacitor electrode which is the third conductive film 118a also serves as a pixel electrode which is connected to the source electrode or the drain electrode of the transistor Tr, which is the second conductive film 116, through an opening portion provided in the fourth insulating film 120.

A method for manufacturing the semiconductor device illustrated in FIGS. 11A and 11B will be described with reference to FIGS. 12A and 12B.

Figure 12A:
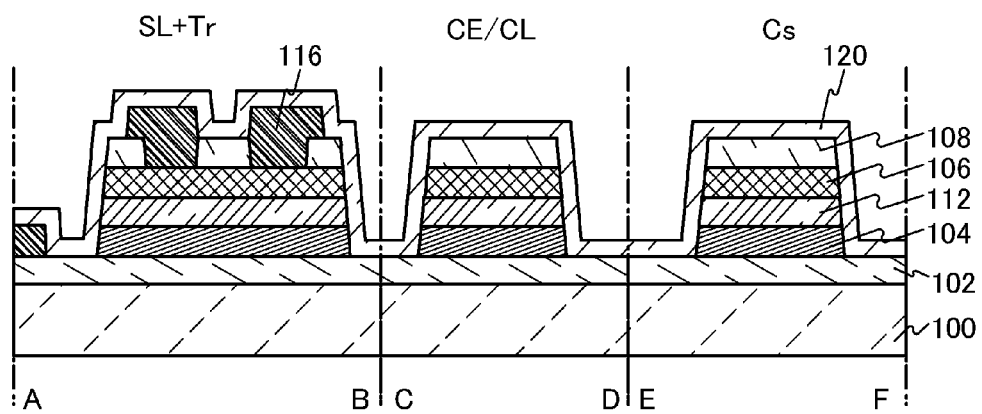
FIGS. 12A and 12B are cross-sectional views illustrating a method for manufacturing a semiconductor device according to one embodiment of the present invention.

FIG. 12A corresponds to FIG. 5B in Embodiment 1. In other words, Embodiment 1 can be referred to for steps before the step illustrated in FIG. 12A.

First, a resist is applied, exposed to light with the use of a photomask, and developed to form a resist mask. With the use of the resist mask, the fourth insulating film 120, the third insulating film 108, the semiconductor film 106, and the second insulating film 112 are etched under such conditions that etching selectivity of the fourth insulating film 120, the third insulating film 108, the semiconductor film 106, and the second insulating film 112 with respect to the second conductive film 116 can be sufficiently obtained. Then, the resist mask is removed (see FIG. 12B).

Next, the third conductive film 118 is formed. A resist is applied over the third conductive film 118, exposed to light with the use of a photomask, and developed to form a resist mask. The third conductive film 118 is etched with the use of the resist mask. Then, the resist mask is removed. Thus, the semiconductor device illustrated in FIGS. 11A and 11B is manufactured.

A structure different from that illustrated in FIGS. 11A and 11B will be described with reference to FIGS. 13A and 13B.

Figure 13A:
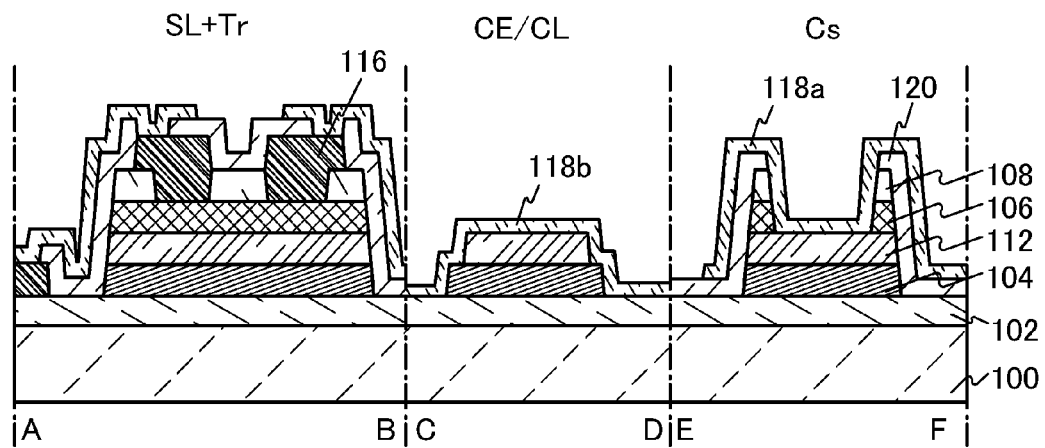
FIGS. 13A and 13B are a cross-sectional view and a top view of a semiconductor device according to one embodiment of the present invention.
Figure 13B:
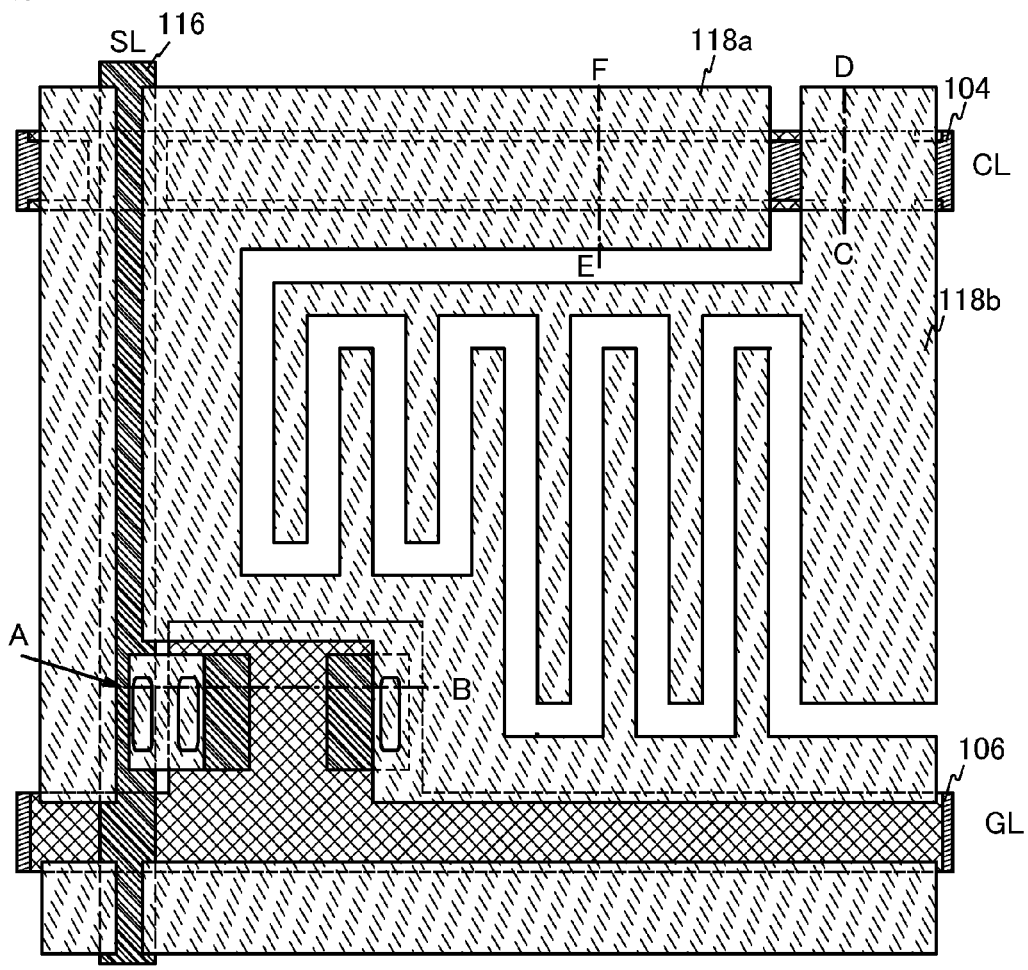

FIGS. 13A and 13B are a cross-sectional view and a top view of a display device manufactured in this embodiment. FIG. 13A illustrates cross sections A-B, C-D, and E-F along dashed lines A-B, C-D, and E-F in FIG. 13B. Note that some films are omitted in FIG. 13B for simplification.

As illustrated in FIG. 11B and FIG. 13B, a feature of an IPS mode is that a pixel electrode and a common electrode CE which are the third conductive film 118a and the third conductive film 118b, respectively, are included. An electric field is generated between the pixel electrode and the common electrode, so that the orientation of liquid crystal molecules can be changed. Although the comb-shaped pixel electrode and common electrode CE are used in this embodiment, the shapes of the pixel electrode and the common electrode CE are not limited thereto and can be a variety of shapes.

The cross section A-B in FIG. 13A may be a structure similar to that of the cross section A-B in FIG. 1A.

The cross section C-D in FIG. 13A illustrates the connection portion of the common electrode CE and the common wiring CL. The connection portion includes the substrate 100; the first insulating film 102 over the substrate 100; the first conductive film 104 over the first insulating film 102; the second insulating film 112 over the first conductive film 104; and the third conductive film 118b which is in contact with the first conductive film 104.

The cross section E-F in FIG. 13A may be a structure similar to that of the cross section C-D in FIG. 1A.

A method for manufacturing the semiconductor device in FIGS. 13A and 13B will be described with reference to FIGS. 14A to 14C.

Figure 14A:
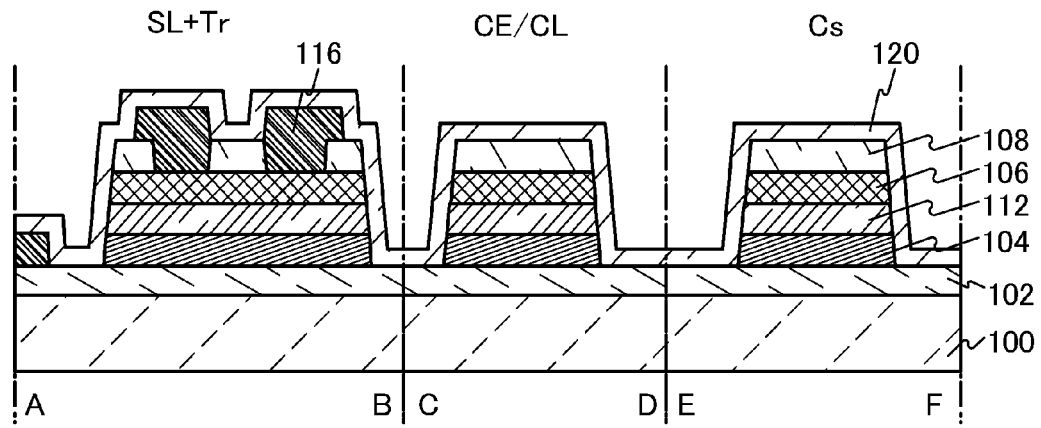
FIGS. 14A to 14C are cross-sectional views illustrating a method for manufacturing a semiconductor device according to one embodiment of the present invention.
Figure 14B:
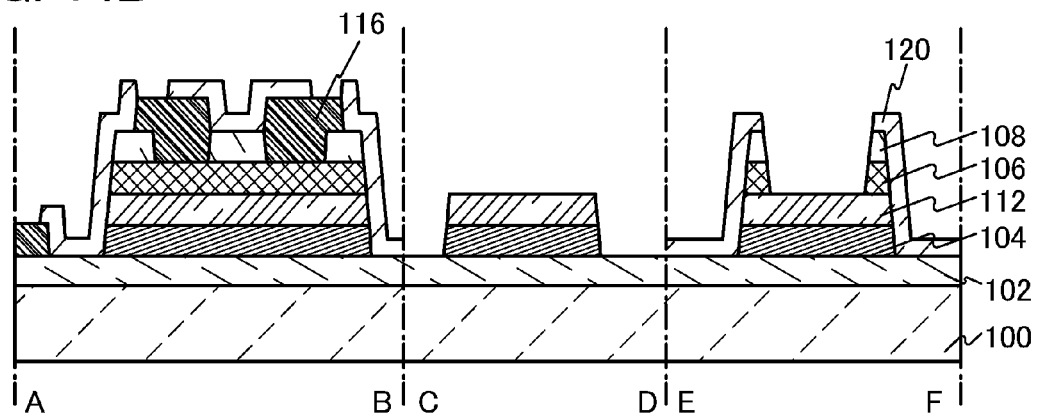

FIG. 14A corresponds to FIG. 5B in Embodiment 1. In other words, Embodiment 1 can be referred to for steps before the step illustrated in FIG. 14A.

First, a resist is applied, exposed to light with the use of a photomask, and developed to form a resist mask. With the use of the resist mask, the fourth insulating film 120, the third insulating film 108, and the semiconductor film 106 are etched under such conditions that the etching selectivity of the fourth insulating film 120, the third insulating film 108, and the semiconductor film 106 with respect to the second conductive film 116 can be sufficiently obtained. Then, the resist mask is removed (see FIG. 14B).

Figure 14C:
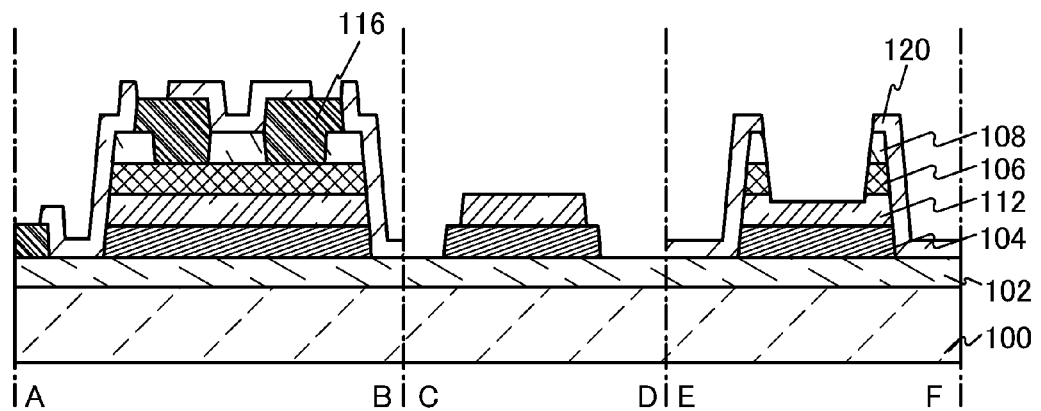

At this time, the second insulating film 112 may be made to recede by over-etching treatment (see FIG. 14C). Thus, the common wiring CL and the common electrode CE can be easily connected to each other.

Next, the third conductive film 118 is formed. A resist is applied over the third conductive film 118, exposed to light with the use of a photomask, and developed to form a resist mask. The third conductive film 118 is etched with the use of the resist mask. Then, the resist mask is removed. Thus, the semiconductor device illustrated in FIGS. 13A and 13B is manufactured.

It is preferable that the third conductive film 118*a* and the third conductive film 118*b* in this embodiment be formed using a light-transmitting conductive film; however, a material of the first conductive film 104, which has low resistance, may be used in order to increase operation speed of a display device.

Through the above steps, a semiconductor device which can be applied to a liquid crystal display device of an IPS mode which is a kind of horizontal electric field modes can be manufactured.

This embodiment can be implemented in appropriate combination with any of the other embodiments.

(Embodiment 3)

In this embodiment, a semiconductor device (a transistor and a capacitor portion of a display device) having a structure different from those in Embodiment 1 and Embodiment 2 will be described with reference to FIGS. 15A and 15B and FIGS. 16A to 16C. The source wiring SL and the transistor Tr, the connection portion of the common electrode CE and the common wiring CL, and a region where the common electrode CE and a pixel electrode TE overlap with each other will be described in parallel with reference to FIGS. 15A and 15B and FIGS. 16A to 16C.

In this embodiment, a semiconductor device which can be applied to a liquid crystal display device of a fringe field switching (FFS) mode which is a kind of horizontal electric field modes will be described.

Since a region where the common electrode CE and the pixel electrode TE overlap with each other forms a capacitor portion in a liquid crystal display device of an FFS mode, it is not needed to form a capacitor portion using a capacitor wiring.

Figure 15A:
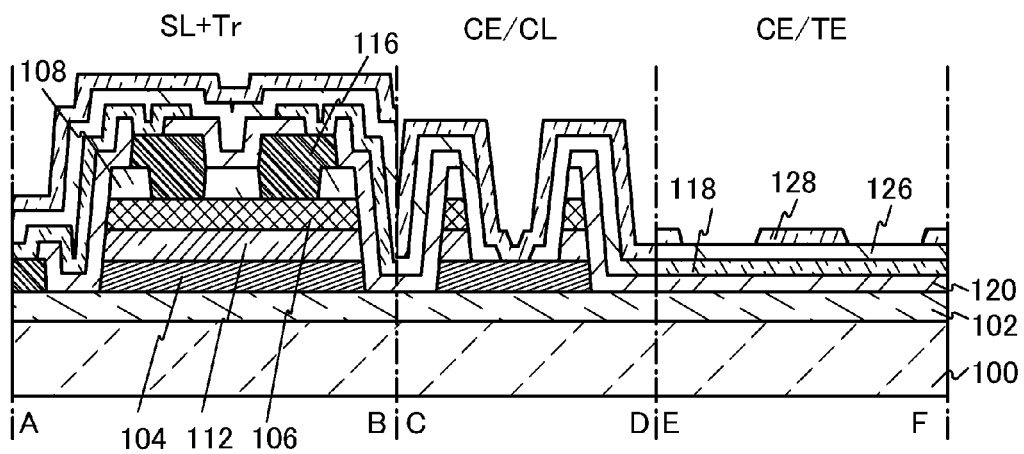
FIGS. 15A and 15B are a cross-sectional view and a top view of a semiconductor device according to one embodiment of the present invention.
Figure 15B:
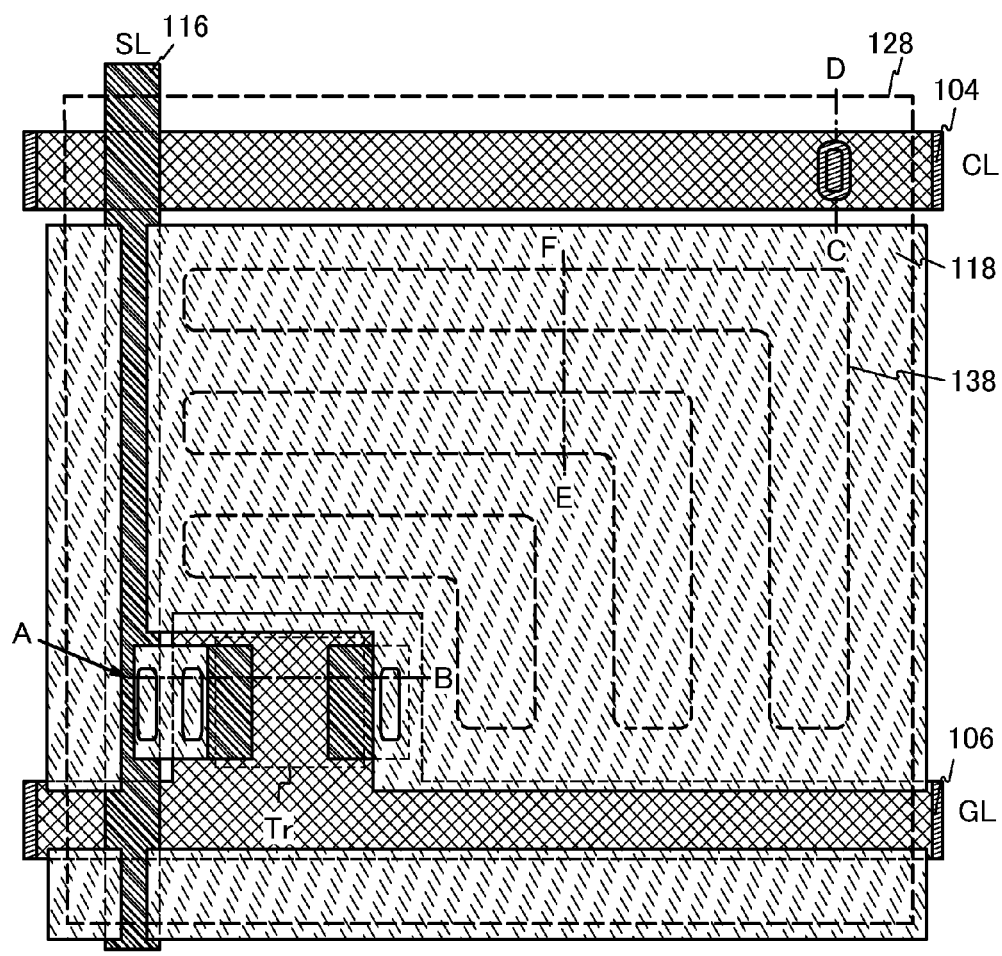

In FIG. 15B, a fourth conductive film 128 is indicated by a dashed line for easy understanding. Note that the fourth conductive film 128 is provided over the entire surface of the substrate 100, and includes L-shaped opening portions 138 as illustrated in FIG. 15B. As illustrated in FIG. 15A, a feature of an FFS mode is that a fifth insulating film 126 is sandwiched between the pixel electrode TE and the common electrode CE which are the third conductive film 118 and the fourth conductive film 128. An electric field is generated between the two electrodes, so that the orientation of liquid crystal molecules can be changed. Although the L-shaped opening portions 138 are provided in the fourth conductive film 128 which serves as the common electrode CE in this embodiment, the shapes of the opening portions 138 are not limited thereto and can be a variety of shapes.

A cross section A-B in FIG. 15A illustrates a structure in which the fifth insulating film 126 is formed over a structure similar to that in the cross section A-B in FIG. 1A and then the fourth conductive film 128 is stacked.

A cross section C-D in FIG. 15A illustrates the connection portion of the common electrode CE and the common wiring CL. The connection portion includes the substrate 100; the first insulating film 102 over the substrate 100; the first conductive film 104, the second insulating film 112, the semiconductor film 106, and the third insulating film 108, which are over the first insulating film 102; the fourth insulating film 120 over the first insulating film 102, the first conductive film 104, the second insulating film 112, the semiconductor film 106, and the third insulating film 108; an opening portion for exposing the first conductive film 104, which is provided in the second insulating film 112, the semiconductor film 106, the third insulating film 108, and the fourth insulating film 120; the fifth insulating film 126 which covers the opening portion and the fourth insulating film 120; and the fourth conductive film 128 which is in contact with the first conductive film 104 through an opening portion provided in the fifth insulating film 126. Outer circumferences of the first conductive film 104, the second insulating film 112, the semiconductor film 106, and the third insulating film 108 are substantially aligned. Although the common electrode CE and the common wiring CL are connected to each other through one opening portion, it is not limited thereto. For example, the common electrode CE and the common wiring CL may be connected to each other through a plurality of opening portions.

A cross section E-F in FIG. 15A illustrates the region where the common electrode CE and the pixel electrode TE overlap with each other. The region includes the substrate 100; the first insulating film 102 over the substrate 100; the fourth insulating film 120 over the first insulating film 102; the third conductive film 118 over the fourth insulating film 120; the fifth insulating film 126 over the third conductive film 118; and the fourth conductive film 128 over the fifth insulating film 126, in which openings are provided.

A method for manufacturing the semiconductor device illustrated in FIGS. 15A and 15B will be described with reference to FIGS. 16A to 16C.

Figure 12B:
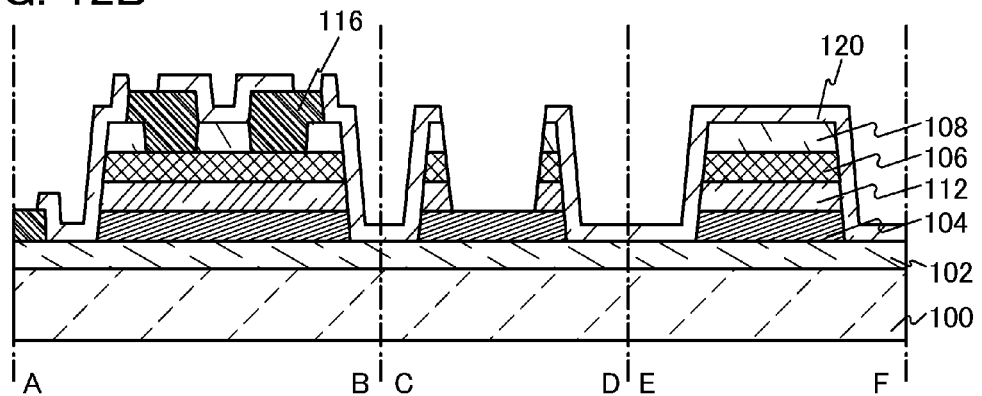
Figure 16A:
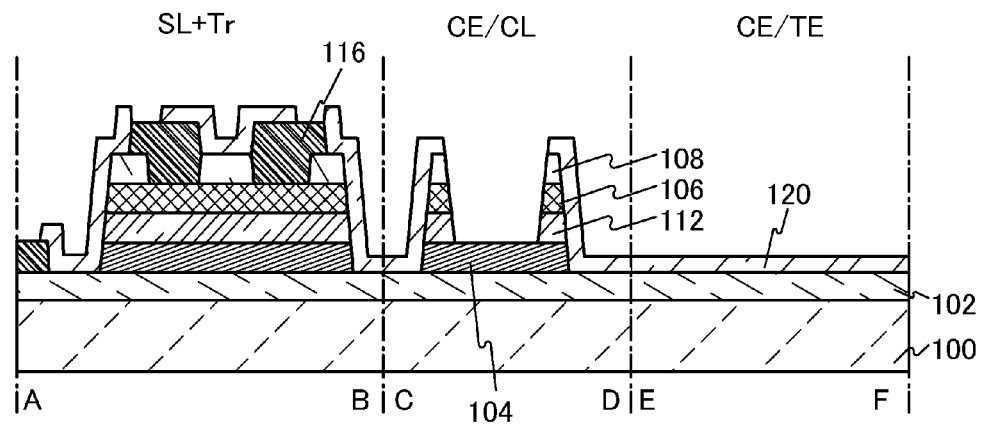
FIGS. 16A to 16C are cross-sectional views illustrating a method for manufacturing a semiconductor device according to one embodiment of the present invention.
Figure 16B:
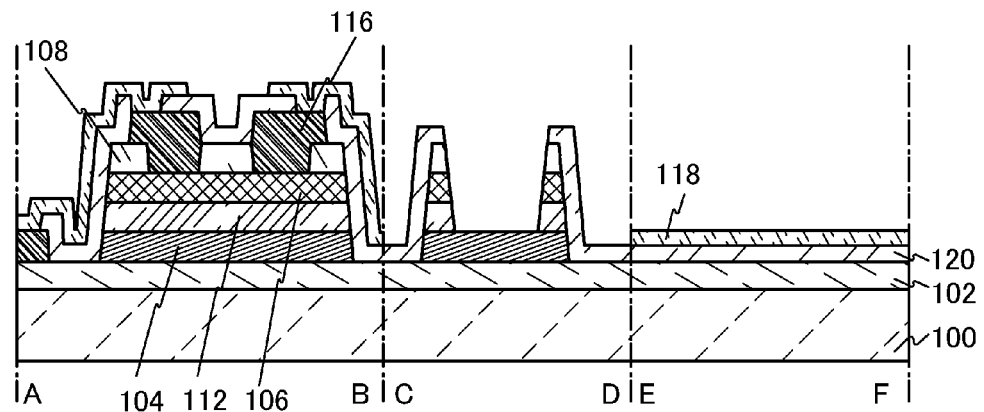

FIG. 16A corresponds to FIG. 12B in Embodiment 2. In other words, Embodiment 2 can be referred to for steps before the step illustrated in FIG. 16A.

First, the third conductive film 118 is formed. Then, a resist is applied over the third conductive film 118, exposed to light with the use of a photomask, and developed to form a resist mask. The third conductive film 118 is etched with the use of the resist mask. Then, the resist mask is removed (see FIG. 16B).

Figure 16C:
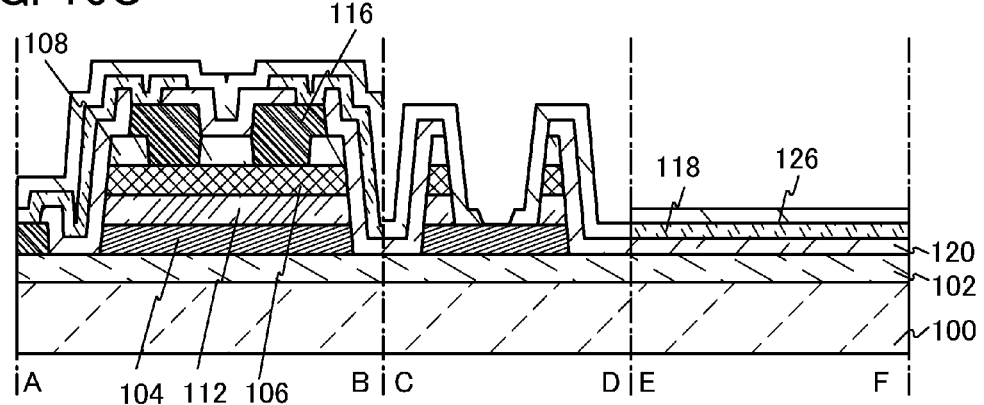
Figure 17A:
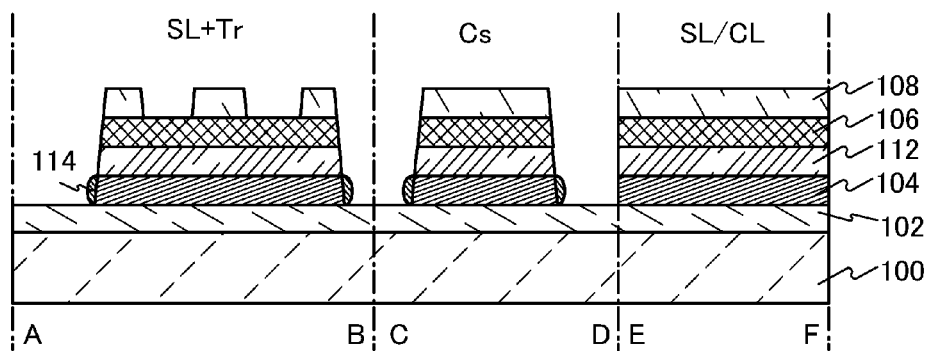
FIGS. 17A and 17B are cross-sectional views illustrating a method for manufacturing a semiconductor device according to one embodiment of the present invention.
Figure 17B:
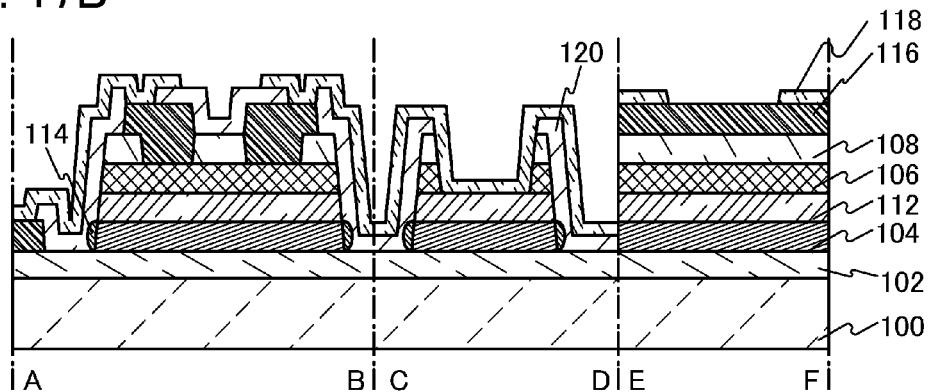

Next, the fifth insulating film 126 is formed (see FIG. 16C).

Next, the fourth conductive film 128 is formed. Then, a resist is applied over the fourth conductive film 128, exposed to light with the use of a photomask, and developed to form a resist mask. The fourth conductive film 128 is etched with the use of the resist mask. After that, the resist mask is removed. Thus, the semiconductor device illustrated in FIGS. 15A and 15B is manufactured.

The fourth conductive film 128 may be formed using a material similar to that of the third conductive film 118 or that of the first conductive film 104.

Through the above steps, a semiconductor device which can be applied to a liquid crystal display device of an FFS mode which is a kind of horizontal electric field modes can be manufactured.

This embodiment can be implemented in appropriate combination with any of the other embodiments.

(Embodiment 4)

In this embodiment, an example of a liquid crystal display device in which the semiconductor device described in Embodiment 1 is used will be described with reference to FIGS. 8A and 8B. Note that in the following description, a liquid crystal display device is described as an example of semiconductor devices. However, an embodiment of the present invention is not limited thereto. The following manufacturing method may be used for manufacturing an electroluminescence (EL) display device, for example.

Figure 8A:
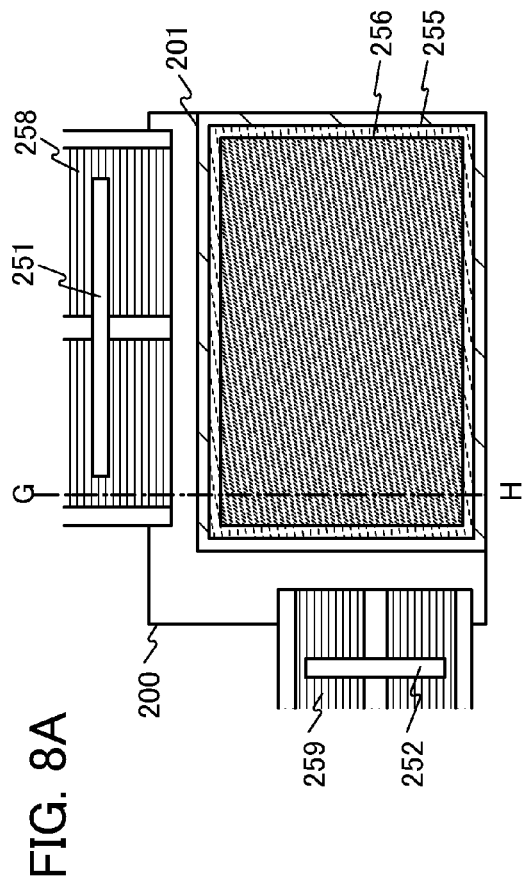
FIGS. 8A and 8B are a top view and a cross-sectional view of a liquid crystal display device according to one embodiment of the present invention.
Figure 8B:
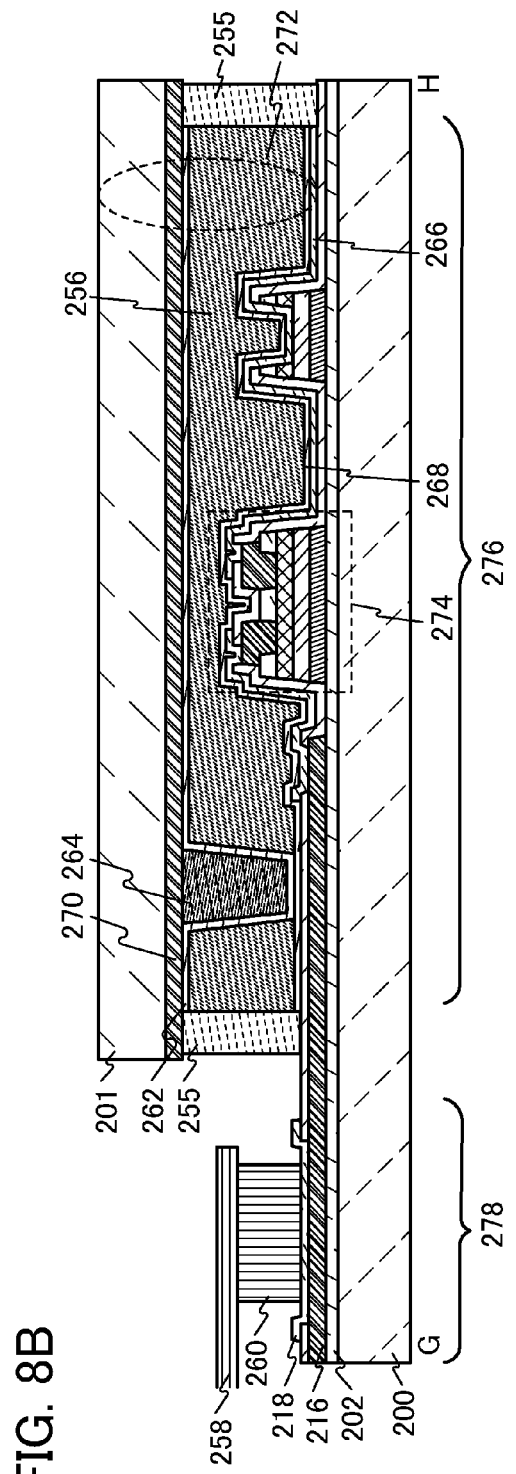

FIGS. 8A and 8B are a top view and a cross-sectional view of a liquid crystal display device in which a transistor 274 formed over a first substrate 200 which is an active matrix substrate and a liquid crystal element 272 are sealed between the first substrate 200 and a second substrate 201 which is a counter substrate with the use of a sealant 255. FIG. 8B illustrates a cross section along a dashed line G-H in FIG. 8A.

The sealant 255 is provided so as to surround a pixel portion 276 provided over the first substrate 200, and the second substrate 201 is provided over the pixel portion 276 with the use of the sealant 255; thus, a liquid crystal 256 is sealed.

Input terminals 278 are provided in a region outside of the region surrounded by the sealant 255 over the first substrate 200. An FPC 258 and an FPC 259 are connected to the input terminals 278. Note that an FPC is an abbreviation of a flexible printed circuit.

The FPC 258 is electrically connected to a signal line driver circuit 251 which is provided over another substrate, and the FPC 259 is electrically connected to a scan line driver circuit 252 which is provided over another substrate. Various signals and potentials supplied to the pixel portion 276 are supplied from the signal line driver circuit 251 and the scan line driver circuit 252 through the FPCs 258 and 259.

In FIGS. 8A and 8B, the signal line driver circuit 251 and the scan line driver circuit 252 are provided over the FPC 258 and the FPC 259, respectively; however, the signal line driver circuit 251 and the scan line driver circuit 252 may be provided over the substrate 200.

The liquid crystal display device illustrated in FIGS. 8A and 8B includes an alignment film 268 covering a pixel electrode 266 of the first substrate 200, a spacer 264 provided for the second substrate 201, and an alignment film 262 which covers the spacer 264 and an opposite electrode 270 and is provided for the second substrate 201. Although not illustrated, a color filter, a light-blocking layer, or the like may be included.

An electrode 218 and a wiring 216 are connected to a terminal of the FPC 258 through an anisotropic conductive film 260. The electrode 218 is formed using the same material and in the same layer as the pixel electrode 266. The wiring 216 is formed using the same material and in the same layer as a source electrode and a drain electrode of the transistor 274. Although not illustrated, a wiring formed using the same material and in the same layer as a gate electrode of the transistor 274 may be connected to the terminal of the FPC 258 through the electrode 218 and the anisotropic conductive film 260. In that case, the wiring formed using the same material and in the same layer as the gate electrode of the transistor 274 needs to be connected to the wiring 216 through a conductive film formed using the same material and in the same layer as the pixel electrode 266. The wiring 204 and the wiring 216 may be connected to each other at any point in the display device. In the case of providing a protective circuit to be described later, for example, it is preferable for circuit design that the wiring 204 and the wiring 216 be connected to each other around the protective circuit.

The transistor Tr described in Embodiment 1 can be used as the transistor 274.

An etch stop film 202 may be provided over the first substrate 200.

As the liquid crystal 256, a thermotropic liquid crystal, a low-molecular liquid crystal, a high-molecular liquid crystal, a polymer dispersed liquid crystal, a ferroelectric liquid crystal, an anti-ferroelectric liquid crystal, or the like may be used. A liquid crystal exhibiting a blue phase may be used as the liquid crystal 256. In the case where a liquid crystal exhibiting a blue phase is used, the alignment films 262 and 268 are not necessarily provided. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral agent is mixed is used for a liquid crystal layer in order to improve the temperature range. The liquid crystal composition which includes a liquid crystal exhibiting a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be improved.

The size of storage capacitor formed in the liquid crystal display device is set in consideration of the leakage current of the transistor provided in the pixel portion or the like so that charge can be held for a predetermined period. In the case where a transistor including an oxide semiconductor in a semiconductor layer in which a channel region is formed is used, it is enough to provide a storage capacitor having capacitance that is less than or equal to $1/3$, preferably less than or equal to $1/5$ of liquid crystal capacitance of each pixel because the leakage current of the transistor is small.

A black matrix (a light-blocking layer), an optical member (an optical substrate) such as a polarizing member, a retardation member, or an anti-reflection member, and the like are provided as appropriate. For example, circular polarization may be employed by using a polarizing substrate and a retardation substrate. In addition, a backlight, a side light, or the like may be used as a light source.

In addition, it is possible to employ a time-division display method (a field-sequential driving method) with the use of a plurality of light-emitting diodes (LEDs) as a backlight. By employing a field-sequential driving method, color display can be performed without using a color filter.

The liquid crystal display device performs display by transmitting light from a light source or a display element. Thus, the substrates and the thin films such as insulating layers and conductive layers provided in the pixel portion where light is transmitted have light-transmitting properties with respect to light in the visible-light wavelength range.

Since a transistor is easily damaged by static electricity or the like, a protective circuit is preferably provided. The protective circuit is preferably formed using a nonlinear element.

As described above, a large display device having high reliability and high display quality can be provided.

Further, by employing one embodiment of the present invention, the number of photolithography steps is reduced, so that cost can be reduced. Moreover, the area of a capacitor portion can be reduced. Thus, a display device having a high aperture ratio and small power consumption can be provided.

This embodiment can be implemented in appropriate combination with any of the other embodiments.

(Embodiment 5)

In this embodiment, examples of electric appliances to which any of Embodiments 1 to 4 is applied will be described.

Figure 9A:
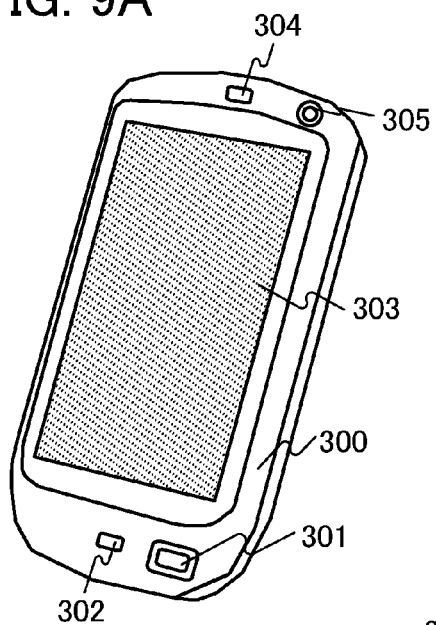
FIGS. 9A to 9C each illustrate an example of an electronic device employing one embodiment of the present invention.

FIG. 9A illustrates a smartphone. The smartphone includes a housing 300, a button 301, a microphone 302, a display portion 303, a speaker 304, and a camera 305, and has a function as a mobile phone. One embodiment of the present invention can be applied to the display portion 303 and the camera 305. Although not illustrated, one embodiment of the present invention can also be applied to an arithmetic unit, a wireless circuit, or a memory device inside the main body.

Figure 9B:
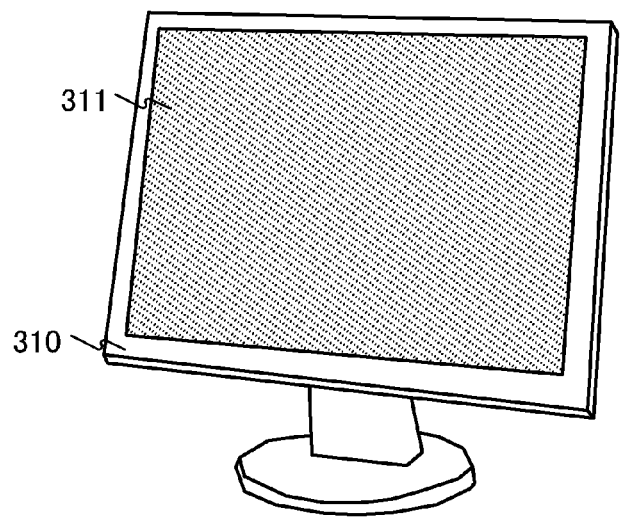

FIG. 9B illustrates a display. The display includes a housing 310 and a display portion 311. One embodiment of the present invention can be applied to the display portion 311. When one embodiment of the present invention is employed, a display having high display quality can be provided even in the case where the size of the display portion 311 is large.

Figure 9C:
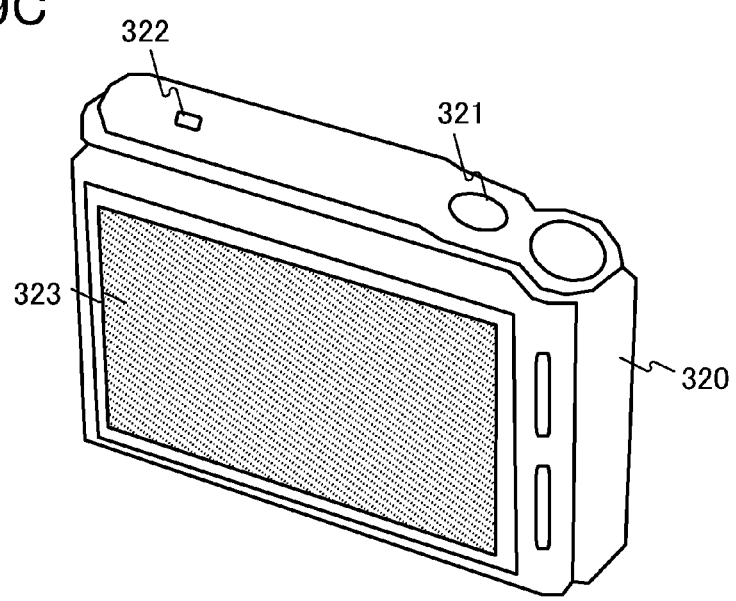

FIG. 9C illustrates a digital still camera. The digital still camera includes a housing 320, a button 321, a microphone 322, and a display portion 323. One embodiment of the present invention can be applied to the display portion 323. Although not illustrated, one embodiment of the present invention can also be applied to a memory device or an image sensor.

When one embodiment of the present invention is employed, cost of an electric appliance can be reduced. Further, a display device having high display quality can be obtained.

This embodiment can be implemented in appropriate combination with any of the other embodiments.

This application is based on Japanese Patent Application serial no. 2010-268444 filed with Japan Patent Office on Dec. 1, 2010, and Japanese Patent Application serial no. 2011-020648 filed with Japan Patent Office on Feb. 2, 2011, the entire contents of which are hereby incorporated by reference.

What is claimed is:

1. A semiconductor device comprising:
    a gate electrode over an insulating surface;
    a gate insulating film over the gate electrode;
    a semiconductor film over the gate insulating film;
    a first insulating film over the semiconductor film, the first insulating film having an opening;
    a first conductive film over the first insulating film, the first conductive film being in contact with the semiconductor film through the opening of the first insulating film;
    a second insulating film over the first conductive film, the second insulating film being in contact with side surfaces of the gate electrode, the gate insulating film, the semiconductor film, the first insulating film and the first conductive film, the second insulating film having an opening; and
    a second conductive film over the second insulating film, the second conductive film being in contact with the first conductive film through the opening of the second insulating film,
    wherein outer circumferences of the gate electrode, the gate insulating film, and the semiconductor film are substantially aligned.

2. The semiconductor device according to claim 1, further comprising a capacitor,
    wherein the capacitor comprises:
        a first capacitor electrode comprising a same material as the gate electrode;
        a dielectric film comprising a same material as the gate insulating film; and
        a second capacitor electrode comprising a same material as the first conductive film or the second conductive film.

3. The semiconductor device according to claim 1, further comprising:
    a common wiring comprising a same material as the gate electrode; and
    a source wiring comprising a same material as the first conductive film,
    wherein the common wiring and the source wiring cross each other with two or more of a first film comprising a same material as the gate insulating film, a second film comprising a same material as the semiconductor film, and a third film comprising a same material as the first insulating film interposed between the common wiring and the source wiring.

4. The semiconductor device according to claim 3, further comprising:
    a gate wiring comprising a same material as the gate electrode,
    wherein the gate wiring and the source wiring cross each other with two or more of a fourth film comprising a same material as the gate insulating film, a fifth film comprising a same material as the semiconductor film, and a sixth film comprising a same material as the first insulating film interposed between the gate wiring and the source wiring.

5. The semiconductor device according to claim 1, wherein at least one of the gate electrode and the first conductive film comprises copper.

6. The semiconductor device according to claim 1, wherein at least one of the gate electrode and the first conductive film comprises a stack of two or more layers.

7. The semiconductor device according to claim 1, wherein at least one of the gate insulating film and the first insulating film is a film from which oxygen is released by heating.

8. The semiconductor device according to claim 1, wherein the semiconductor film is an oxide semiconductor film, a silicon film, a germanium film, a silicon germanium film, a silicon carbide film, or a gallium nitride film.

9. The semiconductor device according to claim 8, wherein the oxide semiconductor film comprises one or more of indium, gallium, tin, and zinc.

10. The semiconductor device according to claim 1, wherein the insulating surface is a surface of a metal oxide.

11. The semiconductor device according to claim 10, wherein the metal oxide is gallium oxide, zinc gallium oxide, tin oxide, tin zinc oxide, aluminum oxide, yttrium oxide, zirconium oxide, hafnium oxide, or tantalum oxide.

12. The semiconductor device according to claim 4, wherein side surfaces of the common wiring and the gate wiring are covered with an insulator.

13. A method for manufacturing a semiconductor device, comprising the steps of:
    forming a first conductive film, a first insulating film, a semiconductor film, and a second insulating film over an insulating surface in this order;
    applying a first resist over the second insulating film;
    exposing the first resist to light with the use of a first photomask which is a multi-tone mask and developing the first resist to form a first resist mask comprising a region with a first thickness and a region with a second thickness;
    etching the second insulating film, the semiconductor film, the first insulating film, and the first conductive film with the use of the first resist mask;
    reducing a size of the first resist mask by plasma treatment to remove the region with the first thickness, so that a second resist mask is formed;
    etching the second insulating film with the use of the second resist mask to expose part of the semiconductor film;
    removing the second resist mask;
    forming a second conductive film for covering the insulating surface, the first conductive film, the first insulating film, the semiconductor film, and the second insulating film;
    applying a second resist over the second conductive film;
    exposing the second resist to light with the use of a second photomask and developing the second resist to form a third resist mask;
    etching the second conductive film with the use of the third resist mask to form a first electrode which is in contact with the exposed part of the semiconductor film;

removing the third resist mask;

forming a third insulating film for covering the insulating surface, the first conductive film, the first insulating film, the semiconductor film, the second insulating film, and the first electrode;

applying a third resist over the third insulating film;

exposing the third resist to light with the use of a third photomask and developing the third resist to form a fourth resist mask;

etching the third insulating film with the use of the fourth resist mask to expose part of the first electrode;

removing the fourth resist mask;

forming a third conductive film for covering the first electrode and the third insulating film;

applying a fourth resist over the third conductive film;

exposing the fourth resist to light with the use of a fourth photomask and developing the fourth resist to form a fifth resist mask;

etching the third conductive film with the use of the fifth resist mask to form a second electrode which is in contact with the exposed part of the first electrode; and removing the fifth resist mask.

14. The method for manufacturing a semiconductor device, according to claim 13, wherein the first conductive film serves as a gate electrode, a gate wiring, a first capacitor electrode, and a common wiring.

15. The method for manufacturing a semiconductor device, according to claim 13, wherein the second conductive film serves as a source electrode, a drain electrode, and a source wiring.

16. The method for manufacturing a semiconductor device, according to claim 13, wherein the first insulating film serves as a gate insulating film, a dielectric film, and an insulating film for keeping insulation of a region where a gate wiring and a source wiring overlap with each other.

17. The method for manufacturing a semiconductor device, according to claim 13, wherein the semiconductor film is an oxide semiconductor film, a silicon film, a germanium film, a silicon germanium film, a silicon carbide film, or a gallium nitride film.

18. The method for manufacturing a semiconductor device, according to claim 17, wherein the oxide semiconductor film comprises one or more of indium, gallium, tin, and zinc.

19. The method for manufacturing a semiconductor device, according to claim 13, wherein the second insulating film serves as an insulating film for keeping insulation of a region where a gate wiring and a source wiring overlap with each other and a protective film of the semiconductor film.

20. The method for manufacturing a semiconductor device, according to claim 13, wherein the third conductive film serves as a pixel electrode, a second capacitor electrode for forming a capacitor portion together with a first capacitor electrode and a dielectric film, and a conductive film which connects a source wiring and a source electrode or a drain electrode.

21. The method for manufacturing a semiconductor device, according to claim 13, wherein at least one of the first conductive film and the second conductive film comprises copper.

22. The method for manufacturing a semiconductor device, according to claim 13, wherein at least one of the first conductive film and the second conductive film comprises a stack of two or more layers.

23. The method for manufacturing a semiconductor device, according to claim 13, wherein the plasma treatment is performed using an oxidizing gas.

24. The method for manufacturing a semiconductor device, according to claim 23, wherein the plasma treatment is ashing.

* * * * *